United States Patent
Andersson

(10) Patent No.: US 7,369,813 B2
(45) Date of Patent: May 6, 2008

(54) FAST CALIBRATION OF ELECTRONIC COMPONENTS

(75) Inventor: Peter Andersson, Helsingborg (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 701 days.

(21) Appl. No.: 10/714,675

(22) Filed: Nov. 18, 2003

(65) Prior Publication Data

US 2004/0230393 A1    Nov. 18, 2004

Related U.S. Application Data

(60) Provisional application No. 60/470,221, filed on May 14, 2003.

(51) Int. Cl.
*H04B 17/00* (2006.01)

(52) U.S. Cl. ............... 455/67.11; 455/67.14; 455/67.13; 455/115.2; 375/295; 375/296

(58) Field of Classification Search ............ 455/67.11, 455/67.13, 67.14, 115.2; 375/295.296
See application file for complete search history.

(56) References Cited

U.S. PATENT DOCUMENTS

| | | | |
|---|---|---|---|
| 5,442,655 | A | 8/1995 | Dedic et al. |
| 6,337,888 | B1 | 1/2002 | Huang et al. |
| 6,393,258 | B1 | 5/2002 | Gambina et al. |
| 6,434,204 | B1 | 8/2002 | Amir et al. |
| 6,968,019 | B2 * | 11/2005 | Darabi et al. ............... 375/316 |
| 7,142,835 | B2 * | 11/2006 | Paulus ....................... 455/302 |

FOREIGN PATENT DOCUMENTS

| | | |
|---|---|---|
| EP | 0477720 A2 | 4/1992 |
| EP | 0851640 A2 | 7/1998 |
| EP | 1033852 A1 | 9/2000 |
| WO | WO 98/52330 A1 | 11/1998 |

OTHER PUBLICATIONS

PCT Search Reported dated Nov. 17, 2004 in connection with International Application No. PCT/EP 2004/004204.
PCT Written Opinion dated Nov. 17, 2004 in connection with International Application No. PCT/EP 2004/004204.

* cited by examiner

*Primary Examiner*—Yuwen Pan
(74) *Attorney, Agent, or Firm*—Potomac Patent Group PLLC

(57) ABSTRACT

The number of measurements needed to calibrate an electrical device is reduced. Apparatus and methods minimize output of one or more unwanted signals by determining a calibration setting, in a minimal number of measurements, from determined distances to a best setting. Each distance to a best setting can be determined as a function of the characteristic of the unwanted signal and the measured unwanted signal level. A calibration setting point can be determined by searching for a setting point having a lowest sum of distance errors determined from the calculated distances and from the measured and non measured setting points. The techniques and apparatus are useful for minimizing a number of measurements that would be needed for determining a setting that substantially prevents generation of unwanted output signals, such as carrier leakage (LO-leakage) and unwanted sidebands, and for quickly determining whether an acceptable calibration setting exists for a device.

51 Claims, 8 Drawing Sheets

FAST CALIBRATION OF ELECTRONIC COMPONENTS

RELATED APPLICATION

This application is related to, and claims priority from U.S. Provisional Application Ser. No. 60/470,221 entitled "Fast Calibration of DC-Offset Compensation" filed on May 14, 2003, the entire disclosure of which is expressly incorporated herein by reference.

BACKGROUND OF THE INVENTION

1. Field of the Invention

The present invention relates to calibration of electronic devices, and more particularly, to techniques for efficiently calibrating these devices to prevent or reduce unwanted signals at the device output.

2. Description of the Related Art

It is often required that the input-output relationship of electronic components be predictable and accurate. For instance, in communication systems, signals conveying information that are transmitted and received, such as voice or data, undergo processing in several stages both before transmission and upon reception. However, several factors can contribute degradation of the signal fidelity from the time the signal is created, transmitted, received and reproduced. As a signal is processed using analog and/or digital processing (DSP) techniques, gain, offset and imbalances of phase may cause errors to be introduced into the signal, which can result in the loss of information and cause unwanted signal interferers. To exemplify how such errors are introduced and how they are compensated according to the conventional solution, a model of a generalized transmitter and receiver will be studied in more detail.

Transmitters include circuits for processing and transmitting source information over a communication channel. The source information may first be imposed on a baseband signal, and may be in the form of an analog or digital signal. Baseband signals are not usually suitable for direct transmission over the communications medium because of their relatively low frequency. Consequently, prior to transmission, baseband signals are imposed onto a carrier signal having a given carrier frequency by means of circuits called modulators. A modulator varies one or more characteristics (e.g., amplitude, phase and/or frequency) of the carrier signal to create a modified carrier signal that not only is suitable for transmission over the channel, but also contains information that enables a receiver to substantially recreate the original baseband signal.

All bandpass waveforms, such as those arising from a modulated carrier signal, may be represented in a convenient form represented by $v(t)=\text{Re}\{g(t)e^{j\omega_c t}\}$, where $\text{Re}\{\circ\}$ denotes the real part of a complex number $\{\circ\}$, $g(t)$ is called the complex envelope of $v(t)$, and $f_c$ is the associated carrier frequency, $\omega_c = 2\pi f_c$. The complex envelope $g(t)$ may be a complex function in real time. In terms of two real functions in Cartesian coordinates, $g(t)=x(t)+jy(t)$, where $x(t)=\text{Re}\{g(t)\}$ and $y(t)=\text{Im}\{g(t)\}$. $x(t)$ is said to be the in-phase modulation associated with $v(t)$, and $y(t)$ is said to be the quadrature modulation associated with $v(t)$. In modem communication systems, the baseband signal is often partitioned into two channels, one for $x(t)$ called the I (in-phase) channel and one for $y(t)$ called the Q (quadrature-phase) channel.

FIG. 1 shows a generalized transmitter that uses in-phase and quadrature-phase (I and Q) processing. As shown in FIG. 1, a modulating signal m(t) (i.e., the source baseband signal) is supplied to a baseband signal processor 1, which uses known techniques to implement a desired modulation type, for example, QPSK, BPSK, BFSK, QM, QAM, or GMSK type modulation. The baseband signal processor outputs the I and Q signals (i.e., x(t) and y(t), respectively) of the desired modulation type. The I and Q signals are supplied to respective mixer circuits 3 and 4 in RF circuitry 2. Mixer circuit 3 multiplies the I signal by a carrier signal (LO signal) supplied by a local oscillator 5 of carrier frequency $f_c$. Mixer circuit 4 multiplies the Q signal with a 90° (or −90°) phase shifted version of the LO signal. The phase shifted signal may be supplied by inputting the LO signal into a phase shift circuit 6 (e.g., a phase splitter). The outputs of the mixers 3, 4 are combined in a summing device 7 to produce the composite signal v(t) suitable for transmission over the communication channel.

A receiver has the job of recovering the source information from the transmitted modulated carrier. In the receiver, a demodulator performs the required inverse mapping to recover the source information mapped onto the carrier signal. The most common types of receivers in use are either the heterodyne or homodyne type. A heterodyne receiver receives the input signal, amplifies it at radio frequency (RF) in a tuned stage, converts the amplified signal to the lower intermediate frequency (IF) by way of two mixers including an offset frequency LO and a 90° (or −90°) phase shifted version of the LO signal, and finally amplifies the mixed signals in tuned IF "strips" containing highly-selective passive bandpass filters. The processed IF signal is later mixed with yet another signal to generate a signal at the original baseband frequency, or is selected by way of a bandpass filter or other detecting means. By contrast, the homodyne receiver skips all processing at an intermediate frequency, and simply uses a mixer to translate the channel directly from RF to 0 Hz center frequency, and each I and Q channel is selected with a lowpass filter centered at DC (when the negative frequency axis is included).

In a modulator or a demodulator, LO-leakage at the inputs will self-mix with the LO signal (i.e., mixing the LO-leakage at the input with the same LO frequency) and lead to a zero-Hz mixing component (i.e., the DC offset) at the output. Self-mixing is mainly a concern in demodulation because LO-leakage at the demodulator input causes undesirable DC offset to appear at the demodulator output, for example, when down-converting a bandpass signal to baseband. On the other hand, LO-leakage at a modulator output often is the result of having DC offset present at the modulator input.

In an RF mixer, there will always be some amount of leakage of the LO signal. The amplitude of LO-leakage at the output will depend on how big the DC offset is at the input. In some applications, there is a need to provide DC compensation to minimize LO-leakage because LO-leakage impairs the modulation accuracy. Therefore, in these applications, the undesirable LO-leakage resulting from a DC offset must be suppressed to a minimum required value. This can be realized by adding compensating DC to the input with the sign opposite from the original DC offset. The DC compensation is generated by an adjustable signal generator whose output signal level is controlled, either directly or indirectly, by the value of a control parameter represented by a number of bits. The control parameter should be set to a value that results in a desired DC compensation level chosen to compensate for the undesirable DC offset.

In an in-phase (I) and quadrature-phase (Q) RF mixer, a number of settable bits may be provided for setting an amount of offset compensation independently in each of the I and Q channels, thus making the settings two-dimensional.

For example, if seven combinations are possible for each channel, there will be a total of 49 possible combinations for setting both channels. In the production of integrated components that include adjustable DC compensation, the amount of DC compensation must be determined individually for each unit. Thus, it is desirable to make as few measurements as possible when setting compensation for LO-leakage in each of the I and Q channels. However, the number of combinations in a two-dimensional configuration leads to delays during the production of circuit components because it is often necessary to make an excessive number of measurements before determining a setting for an acceptable LO-leakage level, or before a determination can be made as to whether it is necessary to discard the circuit component entirely (e.g., when LO-leakage is greater than can be compensated for by any combination of the bits associated with each of the I and Q channels). The conventional methods for setting DC offset compensation are cumbersome, time consuming and cause excessive wear on production facilities, resulting in reduced output production and increased costs.

One solution to the problems associated with the conventional methods is to search for minimum LO-leakage by first changing the DC compensation settings on one channel while not altering the other. After finding the minimum for one channel, the other channel can be searched. By selecting which direction to search based on the difference in LO-leakage, and by starting the search on the second channel with the best setting in place on the first, the number of measurements needed is reduced and will be between 1 and 9 for the 7×7 example. For other grids, the number of measurements will be different. The worst case of 9 measurement iterations includes two "sign changes," one for each I and Q channel, which would be necessary when a particular initial iteration direction (i.e., either in the positive or negative direction) causes the offset to increase. The number of sign changes involved on any one channel can be in the range 0 to 1, for a total number of 0 to 2 sign changes for both channels. In some instances, sign shifts may increase a level of complexity to a calibration process, but most often do not present serious problems.

The calibration methods of the related art require a number of iterative measurement steps that may exceed an acceptable level when considering factors such as increasing efficiency and speed of device production to reduce production cost and complexity. Therefore, there is a need in the art to reduce the number of measurements that would be required when calibrating these components.

SUMMARY OF THE INVENTION

Accordingly, the present invention is directed to a fast calibration method that substantially obviates one or more of the shortcomings or problems due to the limitations and disadvantages of the related art.

In one aspect of the invention, a method for determining which setting of a plurality of device input compensation settings provides minimum unwanted signal at an output of the device comprises applying a signal to an input of the device, setting the device to a first one of the plurality of compensation settings, and measuring unwanted signal level at the first compensation setting determining a first distance from the first compensation setting to a calibration setting resulting in minimum unwanted signal level based on the first measured level and a predetermined characteristic of the unwanted signal. The device is then set to a second one of the plurality compensation settings, unwanted signal level is measured at the second compensation setting, and a second distance is determined from the second compensation setting to the calibration setting based on the second measured level and the predetermined characteristic. The calibration setting is determined based on the first and second settings and the first and second distances.

Another aspect of the present invention includes a method for determining a setting for calibrating an electronic device including a plurality of compensation settings, each corresponding an amount of input compensation from a range of stepped amounts, to provide minimal level of unwanted signal at the device output. The method comprises measuring unwanted signal level at a first setting, calculating a first distance in setting steps from the first setting to a calibration setting resulting in minimal unwanted signal level at the device output based on the first measured level and a characteristic of the unwanted signal, measuring unwanted signal level at a second setting at a distance nearest to the calculated distance from the first setting, and selecting the second setting as the calibration setting if the measured unwanted signal level is less than or equal to a predetermined value.

Yet another aspect of the present invention includes a method for determining whether a device is within a calibration range within one measurement. The method comprises applying a signal to an input of a device, setting the device to one of a plurality of different calibration settings, measuring unwanted signal level at the device output. A distance from the calibration setting to a setting resulting in minimum unwanted signal level at the output is calculated based on the measured unwanted signal level and a characteristic of the unwanted signal, and whether calibration of the device is beyond a range of possible calibration settings is determined based on the calculated distance.

Another aspect of the invention involves a method for calibrating a quadrature modulator including a plurality of set points which can be set to compensate for DC-offset independently in I and Q channels of the modulator. The method comprises applying a signal to I and Q inputs of the modulator, setting the modulator to a first set point, measuring local oscillator (LO) leakage at the modulator output, and determining a first distance from the first calibration set point to a calibration set point corresponding to a DC-offset minimum, wherein said determination is based on the first measured LO-leakage and a gradient of the DC-offset. The modulator is set to a second set point, LO-leakage at the modulator output is measured, and a second distance from the second set point to the calibration set point is determined based on the second measured LO-leakage and the gradient. The calibration set point is determined based on the fist and second distances and the first and second setting points.

Another aspect of the invention relates to a method of selecting a calibration setting for compensating for unwanted signal in a device having a plurality of compensation settings in two dimensions. The method includes applying a signal to two inputs of the device, selecting a first compensation setting, measuring the output signal of the device at the first compensation setting, and a first distance from the first compensation setting to a first set of possible compensation settings of minimum unwanted signal is determined based on the first output signal a gradient of the unwanted signal. A second compensation setting is selected and the output signal of the device is measured at this setting. A second distance from the second compensation setting to a second set of possible compensation settings of minimum unwanted signal is determined based on the second output signal value and the gradient, and the calibration setting is selected from two possible compensation setting points that are common to the first and second sets of possible compensation settings of minimum offset.

Additional aspects and advantages of the invention will be set forth in the description that follows, and in part will be apparent from the description, or may be learned from practice of the invention. The aspects and advantages of the invention will be realized and attained by the system and method particularly pointed out in the written description and claims hereof as well as the appended drawings.

It should be emphasized that the terms "comprises" and "comprising," when used in this specification, are taken to specify the presence of stated features, integers, steps or components; but the use of these terms does not preclude the presence or addition of one or more other features, integers, steps, components or groups thereof.

It is to be understood that both the foregoing general description and the following detailed description are exemplary and exemplary only and are not restrictive of the invention, as claimed.

BRIEF DESCRIPTION OF THE DRAWINGS

The accompanying drawings, which are included to provide a further understanding of the invention and are incorporated in and constitute a part of this specification, illustrate exemplary embodiments of the invention that together with the description serve to explain the principles of the invention. In the drawings.

DETAILED DESCRIPTION

These and other aspects of the invention will now be described in greater detail in connection with exemplary embodiments that are illustrated in the accompanying drawings.

One problem with conventional methods of calibration is that the number of measurements needed to find a required DC-offset compensation setting often exceeds an acceptable number of attempted measurements. One conventional method also involves making at least 9 measurements for a 7×7 grid before it can be determined that a device cannot be calibrated within a range of possible DC compensation settings. However, as the size of the grid is increased, so too is the number of possible settings. Hence, when using the above conventional method an increase in grid size would require a corresponding increase in the number of measurements needed before a determination can be made that a device cannot be calibrated. Even in the case of calibrating in only one dimension, the above conventional method for a 7×7 grid would require at least 5 measurements before it can be determined whether calibration is possible. In addition, known methods sometimes require changing between positive and negative DC compensation, which in a two dimensional case may require up to 2 sign changes before an acceptable setting is achieved. While sign changes are not always a problem in a calibration process, in some cases they may add an unacceptable amount of time and/or a level of complexity to the calibration process.

In addition to the problem of LO-leakage (i.e., carrier leakage) caused by DC offset at the input of a modulator/demodulator, imbalances between the in-phase (I) and quadrature (Q) components that are input into a modulator also lead to an increase of unwanted signals at the output. For instance, baseband I-Q amplitude imbalance and imperfect quadrature imbalance at the output of the phase splitter create unwanted interferers. For example, in single sideband (SSB) modulation, both an imbalance of the input I-Q signal amplitudes and a phase imbalance (e.g., resulting from imperfect shift in the phase splitter or imperfect signal quadrature processing in the baseband circuitry) result in an increase in the unwanted sideband amplitude. While the SSB example illustrates how DC-offsets, imperfect quadrature and amplitude imbalances cause the appearance of unwanted products at some frequency offset from the desired signal, some modulation architectures, for example, quadrature amplitude modulation (QAM), embed these imperfections in the desired spectrum. LO-leakage can cause degradation of QAM signal quality by causing its constellation to become more circular.

Figure 1:
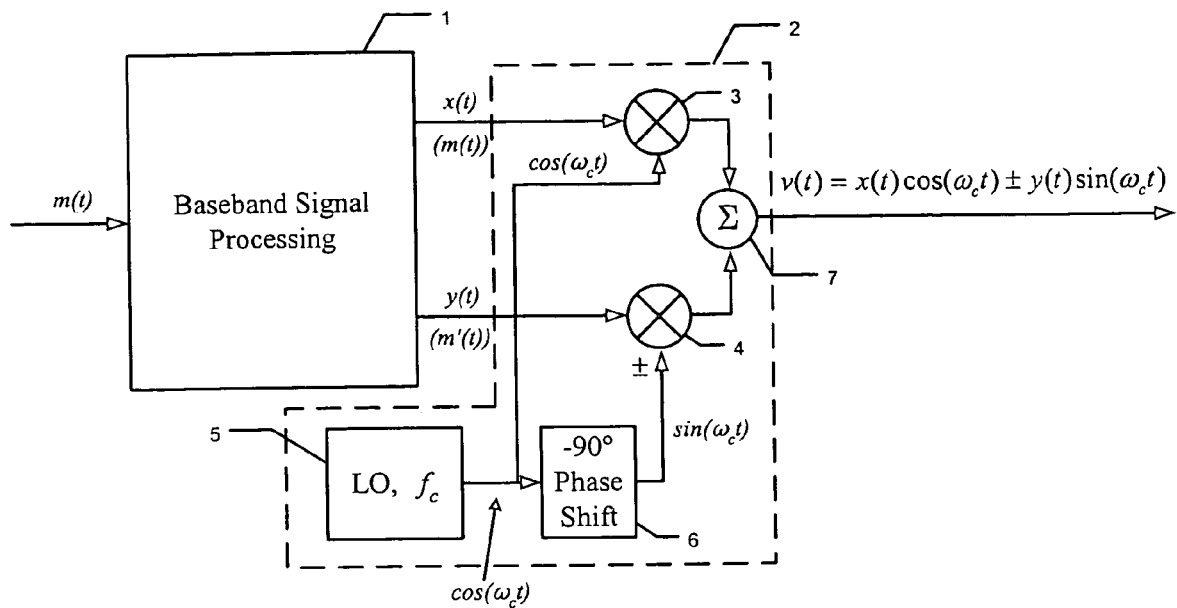
FIG. 1 is a diagram of RF circuitry illustrating a source of unwanted LO-leakage and an application of the present invention.

An I and Q modulator in a radio can be used to generate either single sideband (SSB) or double sideband (DSB) frequency bands, which is decided by the phase difference between the I and Q channels. With reference to FIG. 1, SSB signal generation involves the baseband signal processing circuit 1 providing the source signal m(t) as the in-phase (I) modulation component and m'(t) as the quadrature (Q) phase modulation component. A Hilbert transformer in the baseband signal processing circuit provides m'(t) which is a 90° phase shifted version of m(t) (i.e., the Q component leads (or lags) the I component by 90°). In RF circuitry 2, the I signal component is provided to mixer 3 and is mixed with the LO signal, and the Q signal component is provided to the mixer 4 and is mixed with a 90° phase-shifted version of the LO signal. Summing device 7 adds the outputs of the two mixers 3, 4 to obtain a lower sideband (LSB) SSB signal, or subtracts the mixer outputs to obtain an upper sideband (USB) SSB signal.

The Appendix to this specification includes the derivation of an equation for the output of an I and Q mixer. As can be seen in the output, MixOut, DC offsets present at the I and Q modulator inputs cause the modulator to output unwanted LO-leakage. For instance, in the case of applying a single sideband signal with the amplitude A and DC offsets $I_{offs}$ and $Q_{offs}$ to the I and Q channels, the resulting output signal is proportional to A and the LO-leakage is proportional to $\sqrt{(I_{offs})^2+(Q_{offs})^2}$. When applying a DSB signal to the I and Q channels, the LO-leakage also is proportional to $\sqrt{(I_{offs})^2+(Q_{offs})^2}$, and each of the two output signals is proportional to $$\frac{A}{\sqrt{2}}.$$

When generating SSB using an I and Q modulator, the unwanted sideband ideally cancels when the summer adds (or subtracts) the mixer outputs. However, it is difficult to maintain perfect baseband I-Q amplitude balance and an exact 90° phase relationship between the I and Q signal components (i.e., perfect quadrature), and a perfect phase difference at the outputs of the phase splitter. These imperfections in amplitude balance and phase lead to generation of the unwanted sideband. The I and Q mixer output equation in the Appendix also illustrates the effect on a mixer output when phase and amplitude imbalances between the I and Q channel are present at the inputs of the mixer.

The present invention provides methods for fast and efficient calibration that minimize an amount of measurements needed to calibrate an electrical component. The methods of the present invention also are useful for calibrating a component at its input to minimize unwanted signal generation at the output of the component. The present invention additionally reduces the number of measurements needed for calibrating a device, or for determining that calibration is possible, in one or more dimensions to a minimal number that is independent of the amount of available settings. The present invention also provides a way of quickly determining whether a device can be calibrated in a range of existing calibration settings. While examples discussed herein relate to methods for calibrating quadrature modulation/demodulation devices, it is to be understood that the principles of the present invention may be used to calibrate other types of circuit devices and components and/or to provide compensating calibration for minimizing signals other than LO-leakage and unwanted sidebands of SSB signals. As shown by the following examples, when it is possible to express an unwanted circuit output as a conical, or approximately conical function of input, a compensation setting for the input can be found quickly and efficiently.

Figure 2A:
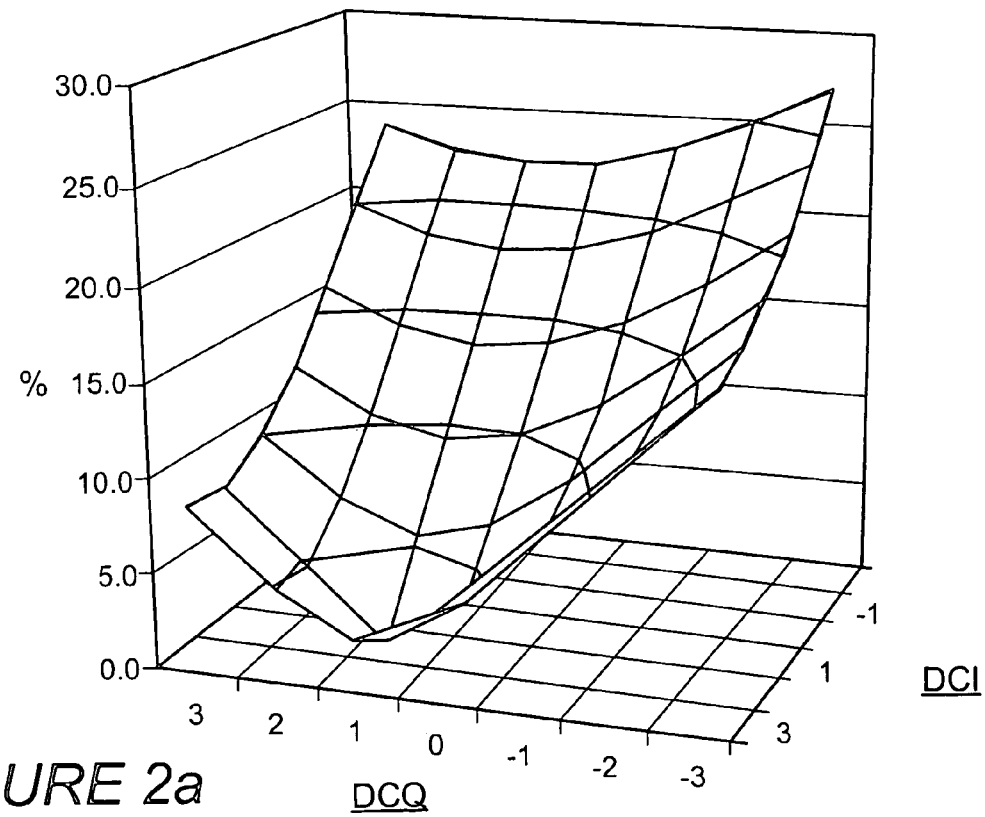
FIG. 2a shows a three-dimensional representation of a DC-offset compensation grid and resulting device unwanted LO-leakage output in percent of wanted signal.

FIG. 2a shows a three-dimensional rendition of an exemplary DCI-DCQ grid of possible DC compensation settings in two dimensions and measured LO-leakage (carrier leakage) converted to linear amplitude values (shown as percentage of the wanted signal, which is often measured in dBm) at all of the DC-compensation settings in the third dimension. The lateral confines of the measured LO-leakage are defined by an exemplary range of DCI-DCQ grid values such that a truncated 3-D cone of LO-leakage levels appears above and within the confines of the grid. The characteristic shape of the LO-leakage is conic because the LO-leakage is proportional to the DC-offset in both grid dimensions. That is, the LO-leakage gradient (i.e., the slope) is the same everywhere (except at the minimum), but with different radian angle about a perpendicular axis through the minimum point.

When it is possible to calibrate a device, the cone center should lie at a point somewhere within a two-dimensional grid. In FIG. 2a, the cone "center" corresponds to LO-leakage minima at the best compensation setting DCI=2, DCQ=1, which respectively corresponds to DC compensation for the respective I and Q inputs. Hence, LO-leakage is minimized by locating the (DCI, DCQ) coordinate point that corresponds to, or is closest to the cone center and setting the DC-offset compensation circuits to values corresponding to that point.

Figure 2B:
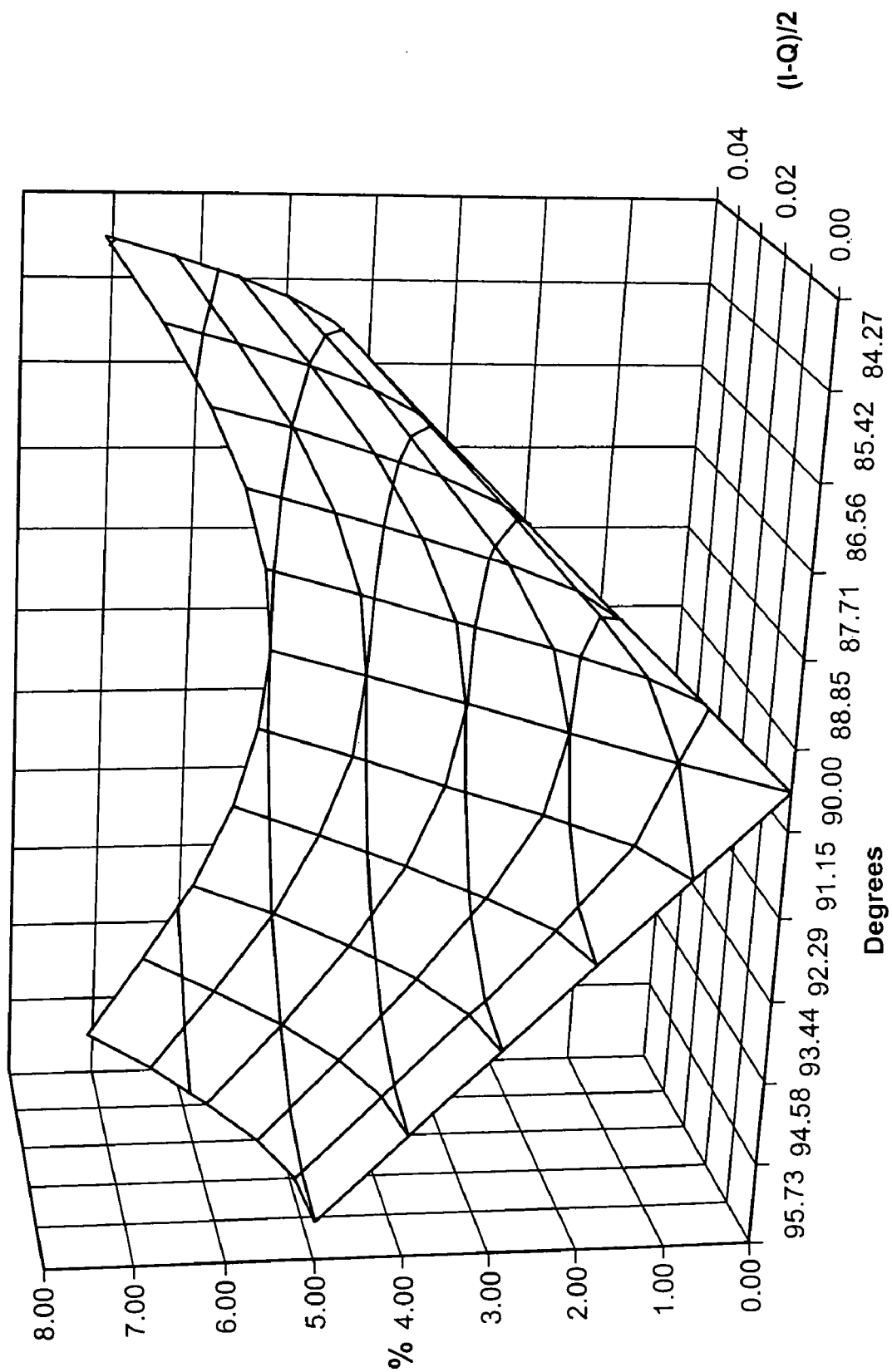
FIG. 2b shows a three-dimensional representation of a phase and amplitude imbalance compensation grid and resulting device unwanted sideband output in percent of wanted signal.

FIG. 2b shows a three-dimensional rendition of an exemplary grid of possible compensation settings in two dimensions for calibrating phase and/or I-Q amplitude imbalances in an I and Q modulator. Also shown in FIG. 2b in the third dimension and within the lateral confines defined by the range of compensation grid is measured unwanted sideband (shown as percentage of the wanted signal and often measured in dBm) at all of the phase and I-Q amplitude imbalance compensation settings. When calibrating to minimize unwanted sideband in single sideband (SSB), one dimension of calibration corresponds to compensating for phase difference between the I and Q channels and another dimension corresponds to compensating for differences in amplitude between the I and Q channels. While the present invention may determine a calibration setting in two dimensions, or whether a device can be calibrated with an existing setting in two dimensions, techniques presented herein also may be used to calibrate in only one dimension (e.g., only for I-Q phase deviation from 90° or only for I-Q amplitude imbalance) or one dimension at a time.

While unwanted sideband level is not conical with respect to phase, FIG. 2b illustrates that for small differences in phase, for example, around 10 degrees, the relationship of the phase difference to the unwanted signal is approximately conical. Hence, the characteristic of phase and amplitude differences versus unwanted signal level shown in FIG. 2b appears as a truncated 3-D cone of unwanted sideband levels above and within the confines of a grid.

Because the calibration methods of the present invention expect the same step size in each dimension (although step size can be adjusted, for example, when calculating distance error), the step sizes of I-Q amplitude and phase differences must be set such that a step in compensation along one dimension results in the same change in unwanted signal as a step in compensation along the other dimension. To obtain the same step size for both amplitude difference and phase difference, the following relation may be used:

A change in the amplitude difference, for example, a difference between normalized I and Q amplitudes (I-Q) of 0.02 ((I-Q)/2 with 0.01), and a change in the phase difference (Q-I) from $\pi/2$ of 0.02 radians, will result in the same change in the quotient of unwanted/wanted sideband amplitudes.

Tables 1 and 2 show an exemplary set of SSB input/output values demonstrating this relation:

TABLE 1

Amplitude difference stepped and phase difference equal to zero

| I-ch. Amplitude | Q-ch. Amplitude | (I − Q)/2 | Unwanted/Wanted Sideband Amplitude |
|---|---|---|---|
| 1.000 | 1.000 | 0.000 | 0.000 |
| 1.010 | 0.990 | 0.010 | 0.010 |

TABLE 1-continued

Amplitude difference stepped and phase difference equal to zero

| I-ch. Amplitude | Q-ch. Amplitude | (I − Q)/2 | Unwanted/Wanted Sideband Amplitude |
|---|---|---|---|
| 1.050 | 0.950 | 0.050 | 0.050 |
| 1.200 | 0.800 | 0.100 | 0.100 |

TABLE 2

Phase difference stepped and amplitude difference equal to zero

| (Q-ch. Phase) − (I-ch. Phase) radians | (Q-ch. Phase) − (I-ch. Phase) degrees | Wanted/Unwanted Sidebands Amplitude |
|---|---|---|
| 1.571 | 90.00 | 0.000 |
| 1.551 | 88.85 | 0.010 |
| 1.471 | 84.27 | 0.050 |
| 1.371 | 78.54 | 0.100 (0.1003) |

With reference to FIGS. 2a and 2b, when a measurement of the unwanted signal is made with the input set at an existing calibration point, the unwanted signal level resides somewhere along a circumference of the cone at a level corresponding to the setting point coordinate values. If the gradient of the cone is known or can be determined, a distance in units of calibration setting step between the measured point and the calibration setting point location for minimum unwanted signal level can be described by an equation for a straight line:

(y1−y0)=k(x1−x0), where $(x_1, y_1)$ are the coordinates of the measured point, $(x_0, y_0)$ are the coordinates for the minimum unwanted signal level, and k is the gradient of the line. At the offset minimum, the coordinate $y_0=0$.

For example, when calibrating for minimum DC offset, $y_1$ would be the DC offset, which can be calculated from a measurement of LO-leakage at a grid setting point. The gradient of the line k is related to coordinates $(x_0, y_0)$ and $(x_1, y_1)$ as follows:

$$k = \frac{y_1 - y_0}{x_1 - x_0}.$$

The distance in units of calibration setting step between the measured point and the point location for minimum DC offset, Dist, is obtained by solving for $x_1-x_0$:

$$Dist = x_1 - x_0 = \frac{y_1 - y_0}{k} = \frac{y_1}{k}.$$

Figure 3:
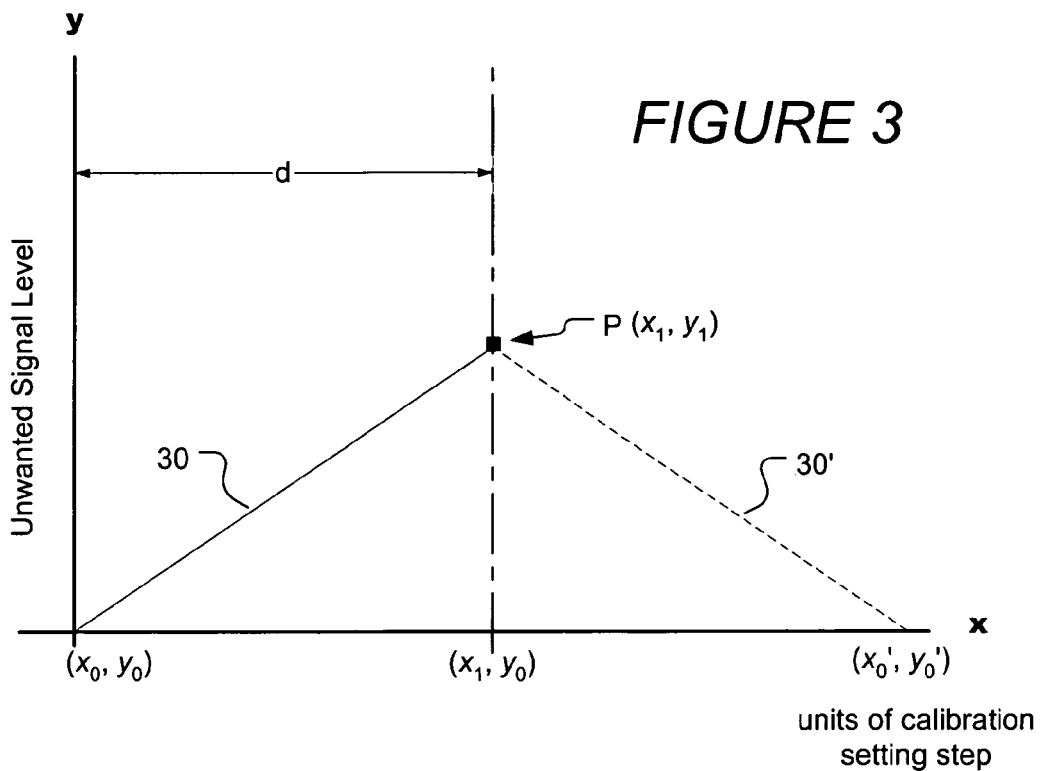
FIG. 3 is a geometrical representation of a method of calculating a distance in accordance with an exemplary embodiment of the present invention.

FIG. 3 graphically illustrates the concept of determining the distance Dist. Line 30 extends from the point P at $(x_1, y_1)$, which corresponds to the unwanted signal level (e.g., LO-leakage level), to the point at $(x_0, y_0)$ where the unwanted signal level is zero. Distance Dist, identified as d in FIG. 3, is the value $x_1-x_0$ in units of calibration setting step. Note that in one dimension, it is not known after one measurement whether the gradient k is positive or negative. This is shown in FIG. 3 by line 30' (shown dashed), which has a negative gradient with respect to lines 30. It should be appreciated that in two dimensions, the line 30 (or 30') would sweep out a set of points along a circle by rotating the lines about the axis 31 through point P.

With respect to calibration of an I and Q modulator for minimal output LO-leakage in a SSB signal, the distance, Dist, may be calculated using the following formulas:

$$DCoffset = \frac{LOleakage(\text{Amplitude})}{WantedSignal(\text{Amplitude})} * InputSignal(\text{Amplitude})$$
$$= InputSignal(\text{Amplitude}) * 10^{SR}$$

$$SR = (LOleakage(dBm) - WantedSignal(dBm))/20$$
$$SR = LOleakage(dBc)/20.$$

The DC offset will be in the same units as the input signal.

$$Dist = \frac{DCoffset}{DC CompensationStepGradient}$$

Thus, for SSB the following formula that may be used for calculating distance:

$$Dist = 10^{(measured\ LOleakage(dBc)/20)} * \frac{InputSignal(\text{Amplitude})}{DC CompensationStepGradient}.$$

A distance may be determined for other types of unwanted signals in a similar way. For example, when calibrating for double sideband (DSB), DCoffset would be divided by $\sqrt{2}$ in the above equations. For calibration of the unwanted sideband, distance may be calculated in terms of measured unwanted sideband signal relative wanted signal, for example. In such a case, the expected gradient would correspond to the change in unwanted signal level per amplitude difference step size or phase difference step size, and may be derived and verified by way of measurement or design. While the following example describes DC compensation for purposes of explaining the concepts of the invention, it should be appreciated that the same concepts may be used to calibrate for minimizing other types of unwanted signals.

The DC compensation step gradient is defined as the difference in applied DC-offset between two calibration settings. The DC compensation step gradient may be derived from the design or derived and verified from measurements. For example, the expected DC compensation step could be obtained from measurements made while stepping DC compensation of one of the channels (ideally, the channel that is not stepped should have a zero DC offset). Statistics from measurements could also be used to adjust a value derived from design.

Figure 4:
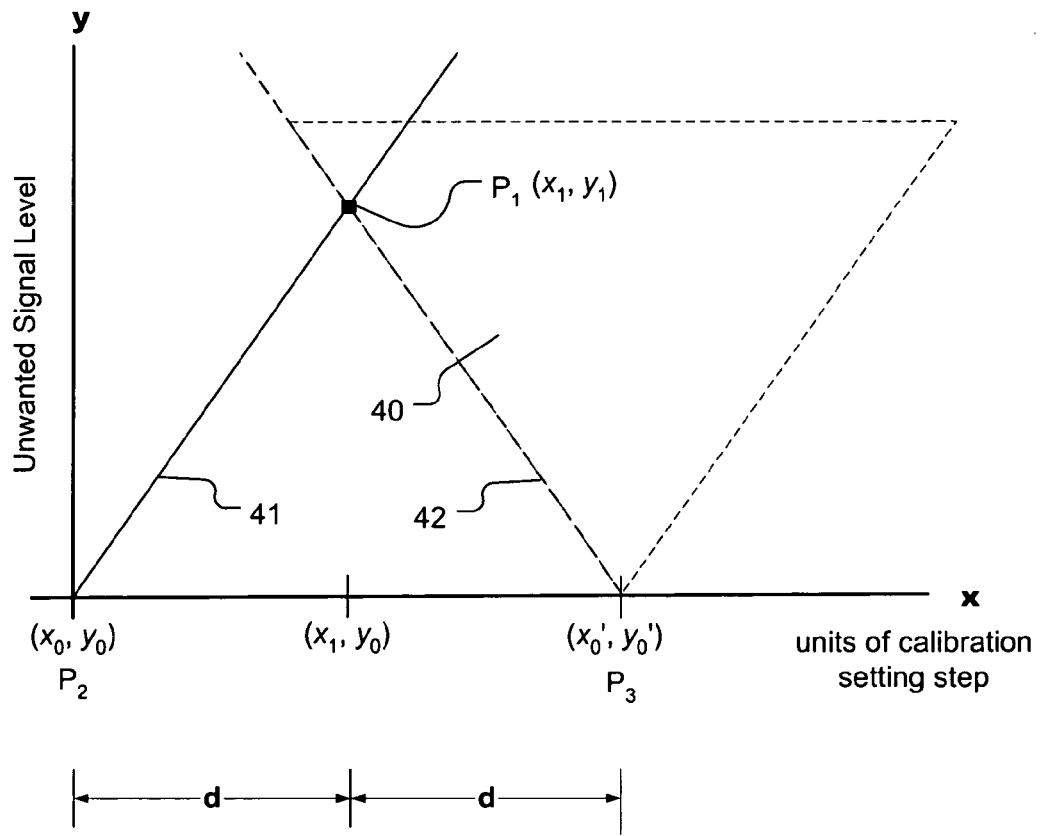
FIG. 4 is a shows the concept of distance in accordance with a one-dimensional exemplary embodiment of the present invention.

FIG. 4 graphically depicts the concepts underlying identification of a calibration setting point in one dimension in accordance with an exemplary embodiment of the present invention. The present embodiment may be used to quickly determine a setting for minimum unwanted signal, for example, to find the minimum DC-offset in the case of a single input modulator or to calibrate a two-input modulator in one-dimension. In FIG. 4, the point P1 at $(x_1, y_1)$ corresponds to a measurement of unwanted signal level at a calibration setting $x_1$. The distance to an expected unwanted signal minimum (as measured in units of calibration setting step) can be calculated based on the equation for a straight line:

$y_1-y_0=k(x_1-x_0)$, where $y_1$ is the measured unwanted signal level (e.g., DC-offset level or unwanted sideband in one dimension) at a calibration setting point $x_1$, and k is the gradient describing a change in unwanted signal relative to a change in units of calibration setting step. As shown in FIG. 4, an output characteristic 40 determines the compensation step gradient along the x-axis. The characteristic 40 may be, for example, a cone bisected by a plane passing through the measured point P and the expected minimum $(x_0, y_0)$, which represents one dimension of unwanted signal characteristic in an I and Q modulator. It is to be understood, however, that characteristic 40 may represent other conical or substantially conical characteristics.

After the first measurement, a check is made to determine whether the distance is greater than an allowable distance to the farthest setting point from the first measured point. If so, the device cannot be calibrated within the limits of the existing setting points. If the distance d is within the allowable distance, a second setting point closest to the distance d is chosen for measurement. As mentioned above, it is not known after only one measurement whether the gradient is negative or positive after the first measurement. Hence, it is possible that the distance d to an expected minimal level is in a direction of point $P_2$ or in the opposite direction of point $P_3$. A setting point at either $P_2$ or $P_3$ is chosen and a second measurement of unwanted signal level is performed. If the second measurement is greater than the first measurement, the minimum should be a setting point closest to a distance d from $x_1$ in a direction opposite the second measured point. If desired, a third measurement for verification may be made at the estimated setting. If the distance from the first measurement point exceeds the range of possible settings, the device cannot be calibrated.

Figure 5:
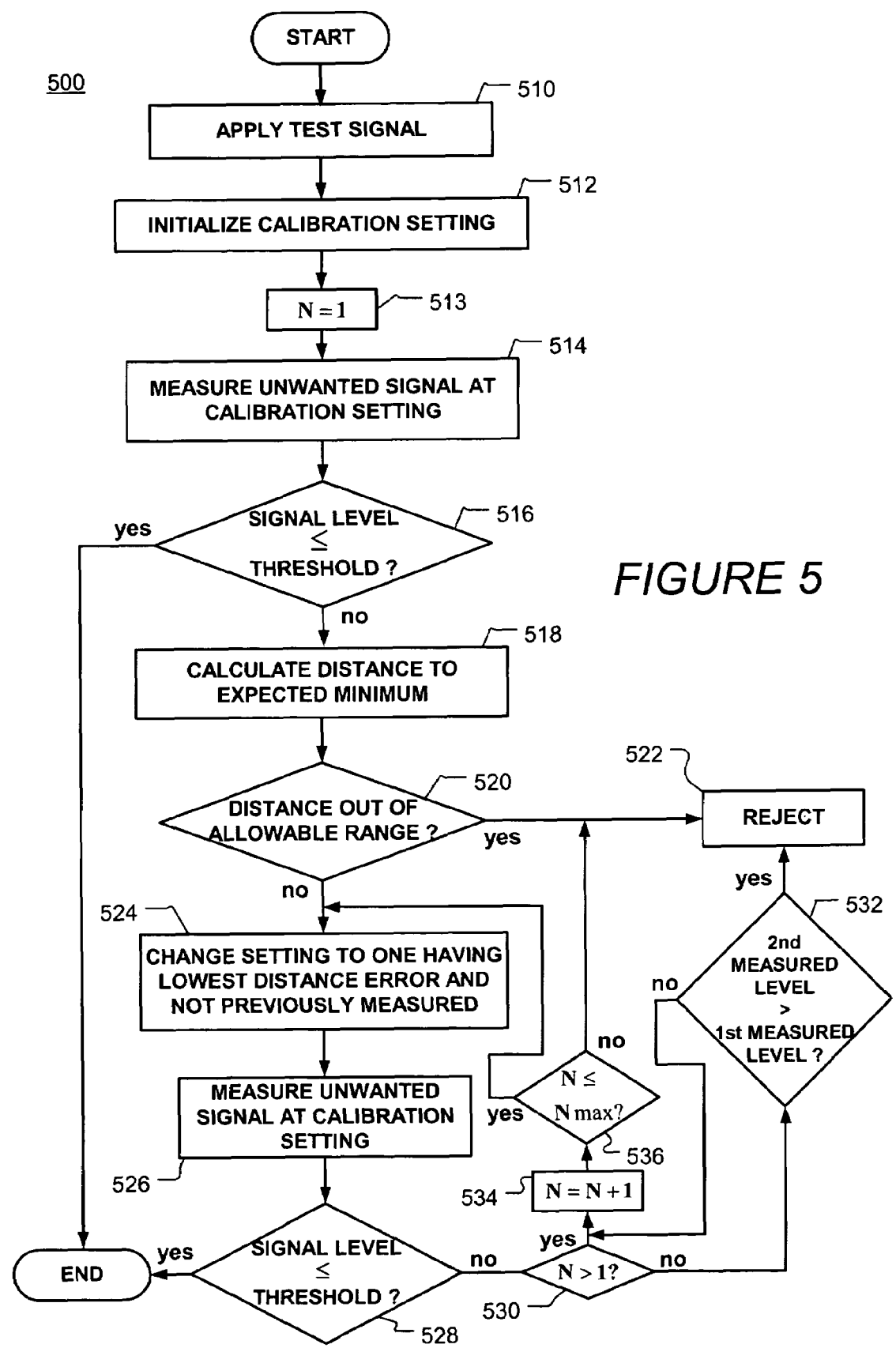
FIG. 5 shows a chart illustrating process flow in accordance with an exemplary embodiment of the present invention.

FIG. 5 shows an exemplary process flow 500 according to an exemplary embodiment for calibrating, in one dimension, an electronic component having a range of compensation settings in one dimension. It is assumed that the compensation step gradient and an allowable threshold level or range for the unwanted signal have been previously determined for the electronic component (e.g., via measurement or design).

Process 500 starts with process 510 in which a test signal is applied to the input of the electronic device. In process 512, the electronic component is set to an initial calibration setting point. The initial setting is preferably selected from one of the end settings of the range of compensation settings. In process 513, a counter variable N is initialized to 1 for determining flow of processes after the first measurement, as will be described later. The unwanted signal level is measured in the first measuring of process 514. The first measurement may be of any unwanted signal that can be expressed as having a substantially conical output characteristic relative to a changing level of compensation input. For example, measured level may be the unwanted signal output in the case of a single input modulator or in the case of calibrating the output of a two input device in one dimension.

The level of the measured unwanted signal is compared to an acceptable allowable threshold level in process 516. If the unwanted level is less than or equal to the allowable level, the "yes" path is taken out of process 516 and the process returns because the calibration setting has been determined. If the level of unwanted signal exceeds the allowable level, the "no" path is taken out of process 516 to process 518, which calculates the distance to a setting of minimum unwanted signal. The distance is calculated based on the slope (gradient) of the characteristic output function and the measured level, as described above. Because the distance is in units of calibration setting step, a decision is made in process 520 as to whether it is possible to find a setting in the existing range of calibration settings. For example, an allowable range can be determined by first dividing the required maximum unwanted signal level (i.e., a predetermined threshold value of the unwanted signal level) by the compensation step gradient and then adding this value to the distance from the current setting to the setting most distant from the current setting. Alternatively, a margin may be subtracted from the resulting distance value (e.g., to account for errors resulting from variances in the test signal source or from measurement errors). The decision 520 to reject the device can be made based on the calculated maximum allowable distance to an existing setting. If the distance calculated in step 518 exceeds the allowable distance, the device is rejected in process 522 and the process returns.

If it is possible to calibrate the device, then in process 524 the calibration setting is changed to a setting having a distance nearest to the calculated distance (i.e., a setting having a lowest squared distance error). A second measurement is made of the unwanted signal level at the new setting in process 526, and thereafter the measured value is compared with the threshold level in process 528. If the signal level is less than or equal to a predetermined threshold, the "yes" path is taken and the process returns because a calibration setting has been determined. If the device can be calibrated within the range of settings, the setting for minimum unwanted signal is found in most cases in the second measurement.

If the condition of process 528 is not met and this is the first pass in the test loop (i.e., N>1="no" in decision 530), a check is made in process 532 as to whether the second measured level is greater than the first measured level. The path to process 532 is controlled by the counter (variable N) such that process 532 is performed only once after the second measurement. In process 532, if it is determined that the second measured level is greater than the first measured level, then the device cannot be calibrated in the existing range of settings and the device is rejected in process 522 and the process returns.

If the second measured level is less than the first, the "no" path is taken out of decision 532, and processing continues at the counter incrementing process 534, where N is increased by 1. Next, process 536 determines whether the current value of N meets or exceeds a predetermined maximum number to prevent an undesirable number of measurements from occurring. If the predetermined maximum N is reached, the chip is rejected, as shown by the "no" path to process 522. If the counter variable N is less than the maximum allowable N value, N max, the process flow loops back to process 524 in which the calibration setting is changed to one having a next lowest distance error. Processes 526 and 528 are repeated for the new setting. If an acceptable calibration setting is not found, processes 530, 534, 536 524, 526 and 528 are repeated until either a calibration setting is found or the maximum N value is reached.

Figure 6:
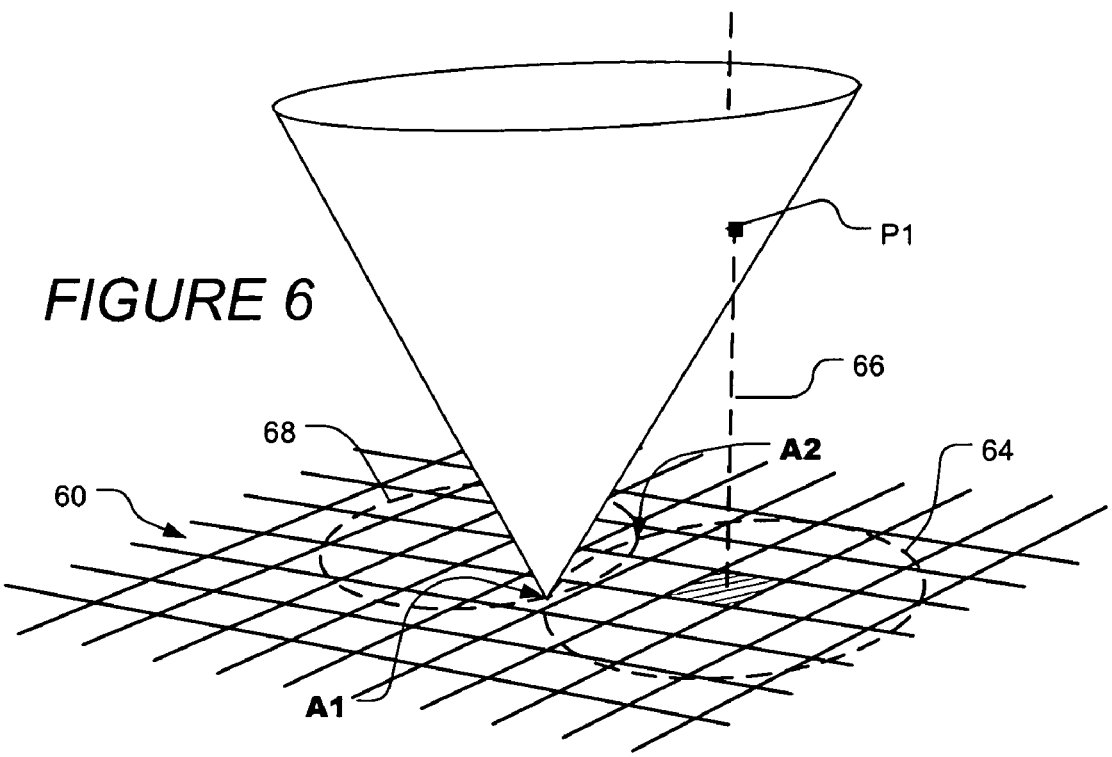
FIG. 6 is a projectional illustration showing the concept of distance in accordance with a two-dimensional exemplary embodiment of the present invention.

FIG. 6 graphically depicts the concepts underlying identification of a calibration point in two-dimensions in accordance with an exemplary embodiment of the present invention. As shown in FIG. 6, a measurement of an unwanted signal level is obtained at point P1 by selecting as an initial calibration setting point in a two-dimensional grid 60. For instance, one dimension of the initial setting point may correspond to an amount of DC compensation, DCI, which is applied to an in-phase (I) channel of a modulator, and the other dimension may correspond to an amount of DC compensation, DCQ, which is applied to a quadrature (Q) channel of a modulator. Each DCI-DCQ calibration point may be selected by setting a number of bits for initial setting or by way of mechanically providing the setting. It is to be understood that the description herein of DC-offset compensation is by way of example and that other types of calibration may be practiced using techniques of the present invention, for example, calibration of signal amplitude and phase difference.

In FIG. 6, the point P1 represents a level of unwanted signal measured at the setting illustrated with crosshatch. Point P1 must reside somewhere on the surface of a cone, as described above. Given the one measured point value, it is known that the cone can have an expected minimum value at possibly any point along a circle 64 defined on the grid 60. These possible minimum values can be visualized by rotating the cone about an axis 66 through the point P1 and perpendicular to the plane of the grid 60. The rotation of the cone sweeps out the circle 64 of radius d, which corresponds to the distance d to all possible minimum values for a cone defined with point P1. Although not shown for the sake of clarity, after a second unwanted signal measurement is made to obtain a second point value P2, another cone including point P2 can be shown to sweep out a second circle 68 using the same procedure as shown for point P1. The intersection points A1 and A2 of these two circles 64, 68 reduce to two the possible calibration settings for obtaining minimum unwanted signal.

Figure 7:
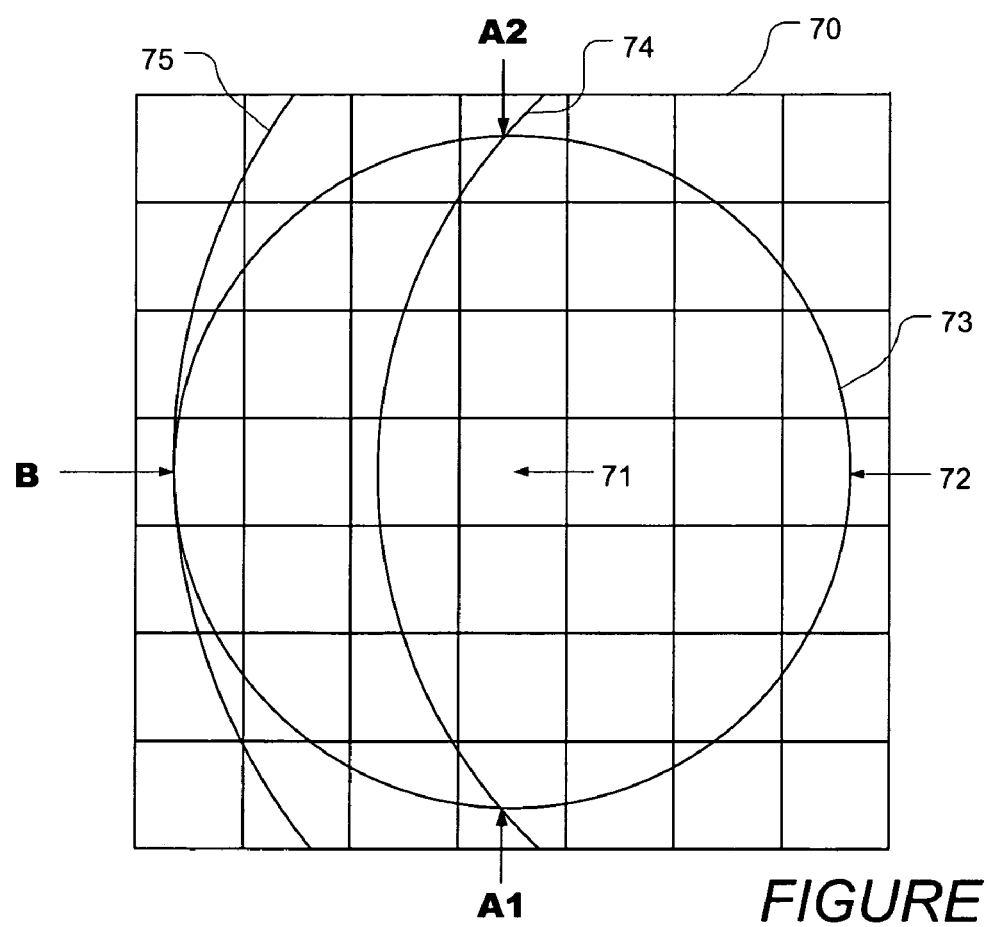
FIG. 7 is a graphical representation of exemplary distances to an expected minimum LO-leakage setting from different measurement settings.

After making two measurements of unwanted signal level at respective calibration coordinates, it may be possible to make an estimate of which point corresponds to a minimum setting. FIG. 7 shows a grid 70, which includes a circle 73 corresponding to a first measurement made at point 71 (i.e. a measurement made while the calibration is set to an amount corresponding to the grid coordinate at point 71) and a resulting distance to an expected minimum of 3 grid units. FIG. 7 also shows exemplary scenarios for a second measurement made at point 72. In a first scenario, the measurement at point 72 results in partial circle 74 having a distance to an expected minimum of 4.2 grid units (from point 72). The second measurement reveals two possible minima at points A1 and A2. Consequently, it is immediately known that the chip can be calibrated within the limits of calibration defined by the grid. It is additionally known that the calibration setting to minimize the unwanted signal is one of the two possible minimum points A1 and A2. At this point, a setting for minimum unwanted signal level can be estimated by measuring the unwanted signal level at one of the two points A1 and A2. If one of these points, A1, A2 is chosen randomly, there would be a 50 percent chance of choosing the correct point. If the incorrect setting point is selected, the remaining point should be the minimum, which can optionally be verified by measuring the unwanted signal at the unselected point.

Thus, when an initial measurement and a successive measurement result in two points of intersection (i.e., two possible minimum), the number of measurements to set the calibration point would be at most 3 without verification and at most 4 with verification. An incorrect guess would imply that a sign change must be made because the two possible minimum setting points always have a different sign in one dimension. Sign changes, however, generally are not a major concern except in special cases. To improve the chances of selecting the correct point after the second measurement, statistical data can be compiled from previous measurements to provide a basis for guessing the correct point with greater probability.

The second exemplary scenario of FIG. 7 shows only one possible minimum at point, B, which is located where circle 73 and partial circle 75 intersect. The intersection at point B illustrates how a minimum calibration setting point can be obtained from only two measurements, which in the present example were made at grid coordinates corresponding to points 71 and 72. In this situation, because the minimum setting point is in line with the measured points 71, 72, there should only be one choice for the minimum setting point. That is, there should only be one setting point having the lowest squared distance error. By making an optional measurement at point B, a verified determination of the minimum calibration setting can be made with at most 3 measurements. Hence, in the second scenario, the number of measurements is only 2 when the option of verification is not preferred.

Figure 8:
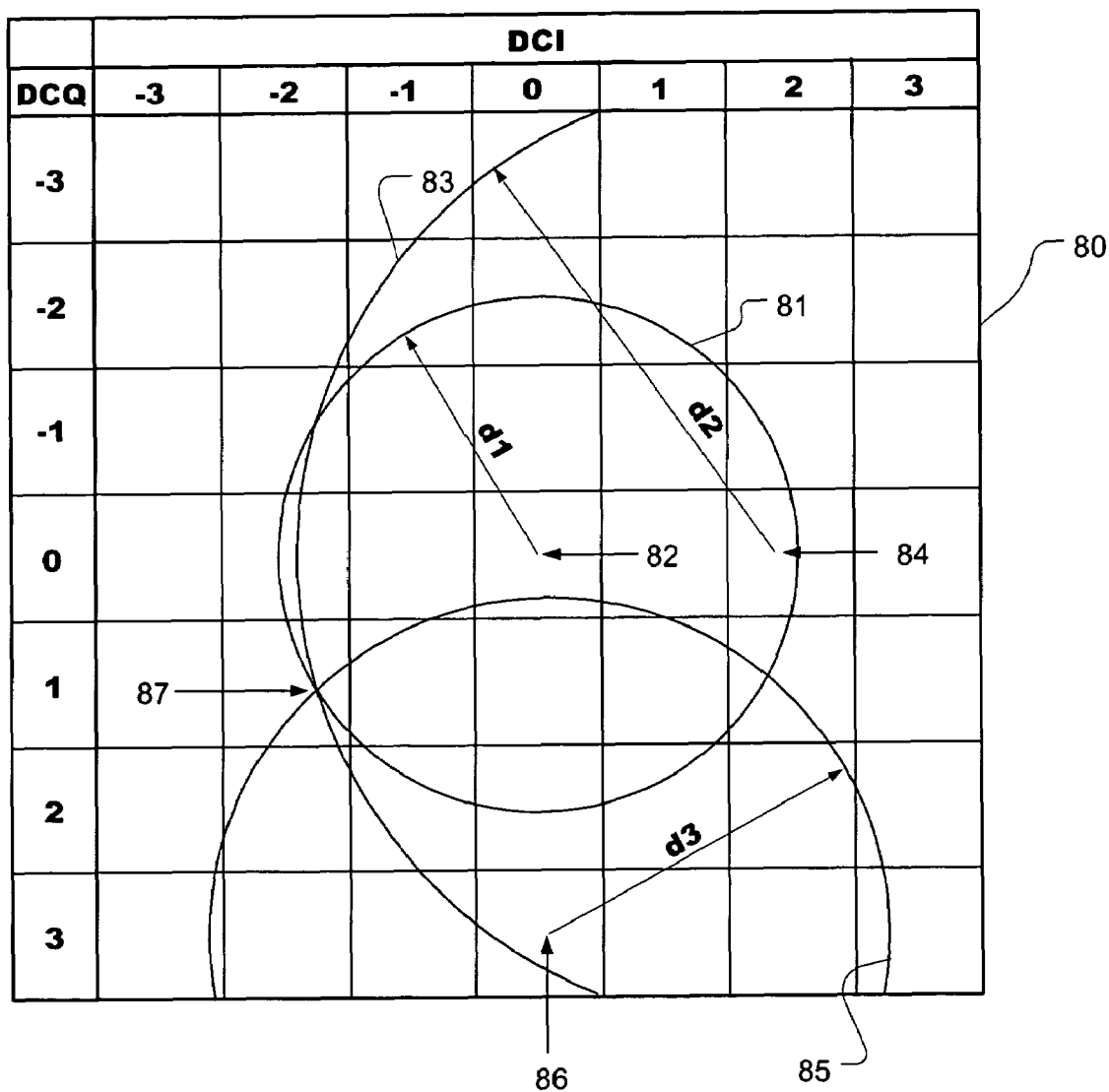
FIG. 8 is a graphical representation of exemplary distances to an expected minimum LO-leakage setting from different measurement settings.

FIG. 8 illustrates an exemplary embodiment of a cross-search for a compensation grid coordinate that will result in a minimum of unwanted signal using calculated distances based on the measured coordinate points 82, 84. While FIG. 8 shows grid coordinates in terms of DCQ and DCI coordinates, it is to be understood that other dimensions of calibration, including different types of compensation in each dimension, may be practiced with the present invention. The choice of grid coordinate points 82, 84 and the calculation of their corresponding distances, d1, d2 can be determined as described above. As shown in FIG. 8, the distance d1 traces out circle 81 associated with point 82, and the distance d2 traces out a circle 83 associated with point 84 (for clarity of illustration, only the portion of circles within the grid 80 is shown). As mentioned above, one way to determine the third measurement point is to consider all the grid coordinates and calculate the least squared distance error to both points 82, 84. From a resulting set of candidate points, a new DCI-DCQ coordinate point having the lowest square distance error may be selected. In the present example, the DCI-DCQ setting point coordinates (−2, 1) and (−2, −1) will have an equal and lowest squared sum of distance errors to both points 82, 84. At this point, there is a 50 percent chance of rightly guessing which of the setting points (−2, 1) and (−2, −1) is the minimum calibration setting point. After selecting a setting point, a third measurement can be made to verify that the selected point is the minimum setting point. If the selected point is not the minimum unwanted signal (i.e., LO-leakage) setting, then the other point having an equal lowest squared sum of distance errors is the minimum setting point. If desired, a fourth measurement may be made at this point to verify calibration.

In applications in which the avoidance of sign shifts is of concern, a third calibration setting point may be selected that does not match d1 and d2, and builds a triangle with the two points 82, 84, for making a third measurement of the unwanted signal. However, such selection lowers the chance of hitting the minimum setting in the third measurement. FIG. 8 shows an exemplary third setting point 86 at coordinate (0, 3). The distance d3 is calculated for this setting point and all the grid coordinates are swept to find the point having the least squared distance error using distances d1, d2 and d3. As seen graphically in FIG. 8, the circle 85 swept out by calculated distance d3 intersects at point 87 with the circles 81 and 83 at DCI-DCQ coordinate point (−2, 1). This point should be the point having the least squared distance error, and thus should also be the best calibration setting point for minimum LO-leakage. If desired, a fourth measurement may be made at DCI-DCQ coordinate point 87 to verify that the LO-leakage is within a predetermined required minimum. It should be noted that if the calculated minimum has a DCQ value of zero (i.e., a point along the axis bisecting the circles 81, 83), then the minimum would always be found and verified with the third measurement.

Figure 9A:
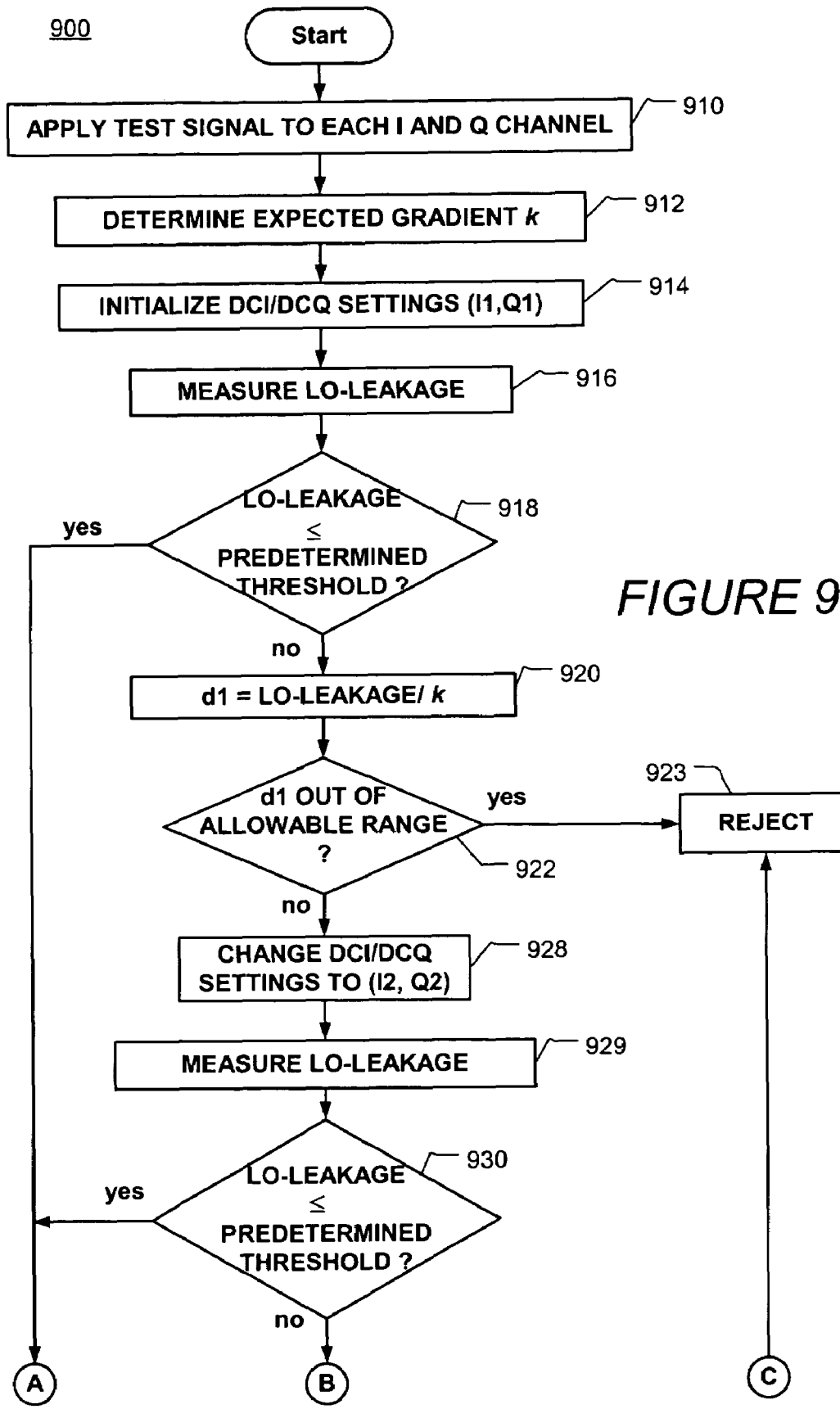
FIGS. 9a and 9b show a chart illustrating process flow in accordance with an exemplary embodiment of the present invention.
Figure 9B:
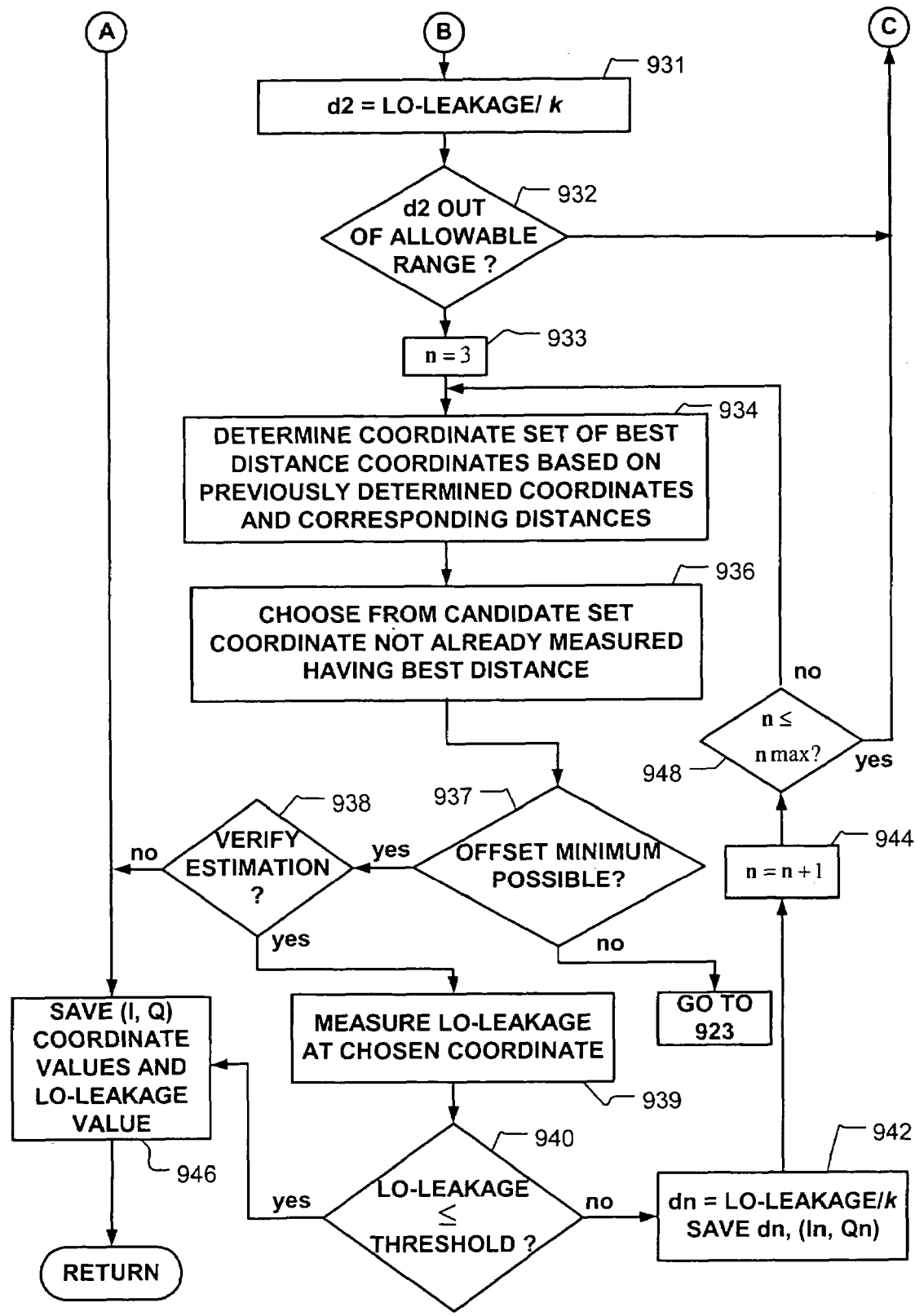

FIG. 9*a* and FIG. 9*b* show an exemplary process flow for determining the calibration settings for an I and Q modulator in accordance with an embodiment of the present invention. In the exemplary process of FIGS. 9*a* and 9*b*, the DCI and DCQ have an equal "expected" step size, ΔDC. The measured LO-leakage is converted to linear amplitude by the equation: LO-leakage level=$10^{(LOleakage(dBc))/20}$, and Q and I are used instead of DCQ and DCI, respectively, to indicate DCQ and DCI coordinates (I, Q). While the exemplary process includes references to a "chip" as the item being calibrated, it is to be understood that the electronic circuit being calibrated may include, for example, one of several electronic components connected by way of one or more printed circuit boards, as well as a single integrated component.

As shown in FIG. 9*a*, the process starts with the application of a test signal. For example, the test signal of either a sine wave at full-scale amplitude or square wave having amplitude of about 50 percent of full-scale may be applied to the inputs of both the I and Q channels of the modulator. In process 912, the expected gradient k is determined. The expected gradient may be a predetermined value that was derived from design. Alternatively, the expected gradient may be computed by dividing the expected step size value, ΔDC, for one of the I and Q channels by the full-scale signal level value. These values may be made either in terms of amperage or of voltage. ΔDC may be obtained from the modulator design or by measuring sample modulators while stepping DC compensation in one of the channels. If desired, a determined expected gradient value may be adjusted based on statistics from the measurements.

Next, in process 914, the DCI and DCQ bits of the modulator are set to a default setting. For example, the default setting may be the DCI-DCQ coordinates that correspond to zero DC-offset compensation on both I and Q channels of the modulator (e.g., (I1=0, Q1=0), which lies in the center of the grid). A zero default setting would be optimal when it is desired to know from the first measurement whether a compensation setting is outside the existing calibration setting range (i.e., one which resides outside the grid). However, it is to be understood that the choice for a default setting may be based on a number of considerations. For instance, the choice for a setting point may include a location based on DCI-DCQ grid coordinates locations that were determined to increase a chance of finding the minimum setting in the first measurement.

At the default DCI-DCQ setting, the relative power between the carrier and the test signal is measured at the modulator output, as indicated in process 916. This measurement also can be made at any other frequency produced in the modulator, such as at an IF frequency of a superheterodyne radio modulator. In process 918, the measured output value is compared with a predetermined threshold value. If the condition of process 918 is met, the process flows along the "yes" path out of the decision block of process 918. The measured LO-leakage value and the coordinate setting (I1, Q1) are then saved as the calibration setting point in the process 946 of FIG. 9*b*, and the process ends. For example, a status flag, best setting, best DC-offset and/or best LO-leakage can be saved for each chip. This saved information can be used as statistics regarding which setting to select as the first setting, which direction to take when making subsequent measurements, whether the expected gradient value should be adjusted, etc.

If the measured LO-leakage exceeds the acceptable threshold value, the process flow takes the "no" path out of the decision block of process 918 to process 920. In process 920, the distance d1 from the measured coordinate (I1, Q1) of the DCI-DCQ grid to coordinates of the expected minimum is determined. As discussed above, d1 may be computed by dividing the measured LO-leakage by the expected gradient, k. For example, when using single side band, the distance may be calculated with following formula:

$$d = \frac{10^{(measured\ LOleakage\ (dBc)/20)} * InputSignal(\text{Amplitude})}{DC\ CompensationStepGradient}.$$

Distance d1 defines the radius of a circle of all possible locations of expected minimum LO-leakage on the DC-offset compensation grid (i.e., the DCI-DCQ grid) corresponding to the LO-leakage measured at the default DCI-DCQ grid coordinate. The value of d1 is saved for the coordinate (I1, Q1).

At this point of the calibration process, it is possible to determine from the calculated distance d1 whether the chip should be rejected. This determination is made in process 922 of FIG. 9*a*. In process 922, a decision is made as to whether all the expected minima defined by distance d1 reside outside an allowable range of all grid settings. The maximum allowable distance can be determined by first dividing the required maximum DC-offset (i.e., the predetermined threshold value) by the expected DC compensation step gradient, and then adding this value to the distance from the current setting to the setting most distant from the current setting. Alternatively, a margin may be subtracted from the distance d1 (e.g., to account for DC-offset in the test signal source or from measurement errors). A decision to reject the chip can be made based on the calculated maximum allowable distance to an existing DCI-DCQ coordinate. If it is determined that the distance d1 lies outside the calibration range, the chip is rejected by proceeding from process 922 to process 923. The results of a rejected chip may optionally be saved to a file for statistical or processing purposes by proceeding from process 923 to process 946. If desired, the measurement of the initial setting point may be repeated to verify this determination.

Returning to process 922, if d1 is determined to be within the allowable range of existing DCI-DCQ settings, then the DCI-DCQ bits are set to a new DCI-DCQ coordinate setting (I2, Q2) (i.e., a second measurement point) in process 928. The second measurement point (I2, Q2) may be determined, for example, by maintaining one of the setting coordinates at the current level and adding (or subtracting) the distance value d to the other setting coordinate. However, any DCI-DCQ grid setting point other than the initial setting may be chosen for the second point (I2, Q2). Whatever choice is made for the second DCI-DCQ coordinate (I2, Q2), the value should be rounded to the nearest integer (corresponding to an existing setting point), but not larger than a maximum DCI or DCQ grid value.

In process 929, LO-leakage is measured at the (I2, Q2) DCI-DCQ grid setting and a determination is made in process 930 as to whether the measured value is less than or equal to the predetermined threshold value. If this condition is met, the "yes" path is taken out of the decision block of process 930 to process 946 (see FIG. 9b), which saves the coordinate values and corresponding LO-leakage value. If the measured LO-leakage value does not meet the predetermined threshold requirement, the process flow proceeds along the "no" path out of the decision block of process 930 to process 931.

Referring now to FIG. 9b, in process 931, a distance d2 is determined from the measured coordinate (I2, Q2) of the DCI-DCQ grid to an offset compensation setting (and points between actual settings) of expected offset minima. As described above for distance d1, the distance d2 is computed by dividing the LO-leakage measured at point (I2, Q2) by the expected gradient, k. The distance d2 corresponds to the radius of a circle defining all possible places for the minimum DC-offset for the setting point (I2, Q2) on the DCI-DCQ grid. In process 932, decision is made as to whether all the expected minima defined by distance d2 reside outside an allowable range of all component settings. This decision is carried out in a manner as described above for step 922. When it is determined that the distance d2 lies outside the calibration range, the chip is rejected by proceeding from process 932 to process 923. If desired, the measurement of the second setting point may be repeated to verify this determination.

If distance d2 is determined to be within an allowable range, its value is saved for the coordinate (I2, Q2). In process 933, a test number, n, is initialized to 3 to indicate the current number of coordinate points being considered. Next, calculations are performed in process 934 to find a set of candidate DCI-DCQ coordinates that have the most correct distances to both of the two points (I1, Q1) and (I2, Q2). In the present example, all the coordinates of the DCI-DCQ grid are considered to find the points having an associated lowest squared sum of distance errors using the following equation:

$$d3\_err^2 = (d1 - \sqrt{(I3test - I1)^2 + (Q3test - Q1)^2})^2 + (d2 - \sqrt{(I3test - I2)^2 + (Q3test - Q2)^2})^2$$

From the resulting candidate set, a new point is chosen that has the lowest squared sum of distance errors (hereinafter, "best distance") and that has not been measured. Of course, other known methods may be used to determine the most correct distances to the measured points. For example, the absolute value of the distance error for each point can be used instead of squaring the values, and the weighting of the distance errors would be adjusted according to their size.

In process 936, a point is chosen from the candidate set of calculated best distance coordinates. When two points of the candidate set have best distances that are equal to one another, it is preferable to choose a point that has a new DCQ coordinate if the first two measurements were made along a DCI axis, or a point with a new DCI coordinate if the first measurements were made along a DCQ axis. For instance, with reference to FIG. 7, it can be seen that when two points have equivalent best distances (e.g., points A1 and A2), each will have a coordinate spaced from the axis in which the measurements were made by an equal amount, one on each side of the axis. Alternatively, it is possible to simply choose a coordinate point that does not match d1 or d2, and which builds a triangle with the coordinate points (I1, Q1) and (I2, Q2). While the probability of hitting the minimum setting point in the third measurement would be lowered by such choice, this may be acceptable for some applications.

Changing between positive and negative compensation (i.e., a "sign change") may be necessary when a measured LO-leakage value for a selected point indicates that a point should have been selected of opposite DC compensation polarity. This may be cumbersome for some calibration equipment and/or consume an unacceptable period of time in some applications of the present invention. When it is desirable to avoid sign changes, only points with positive coordinates could be chosen in process 936. Ideally, a point should be chosen having the best distance. If the point having the best distance has been used, or it is not desired to use this point for another reason, a point having positive coordinates and the next-lowest sum of squared distance errors may be selected. This process may be repeated, as explained later. Alternatively, a point having positive coordinates may be selected that does not match distances d1 and d2 (i.e., a point not in the candidate set) which builds a triangle with the coordinate points (I1, Q1) and (I2, Q2). Of course, instead of choosing only points corresponding to positive DC-offset grid coordinates, the present invention can be practiced in embodiments that choose only negative grid coordinates.

Process 937 determines whether it is possible to find an acceptable minimum DC-offset setting within the calibration range of the DCI-DCQ grid. This involves determining whether an acceptable setting for a LO-leakage minimum is near enough to the chosen best distance setting. The maximum allowable distance to the chosen setting can be calculated by dividing the required maximum DC-offset (i.e., the predetermined threshold value) with the expected DC compensation step gradient to let as many chips as possible pass. A margin can be added to the required maximum DC-offset due to DC-offset from the signal source and measurement errors. If the calculated allowable distance is not sufficient for finding an acceptable point within the grid, a decision can be made that the chip cannot be calibrated. Thus, when a determination is made that the calculated allowable distance exceeds the range of calibration, the process flow proceeds along the "no" path from process 937 to process 923 and the chip is rejected. As described above for process 923, the coordinate value and corresponding measured LO-leakage can be saved by proceeding from process 923 to process 946.

When estimation of an offset minimum is possible and it is decided in step 938 not to verify the estimation, the chip is approved by taking the "no" path from process 938 to process 946. Here, a margin can be subtracted from the required maximum DC-offset due to DC offset from the signal source and measurement errors. In process 938, if it is decided to verify the estimation by measurement, the "yes" path is taken from process 938 to process 939 in which the DCI and DCQ are set to the estimated setting point and the LO-leakage corresponding to this point is measured. In process 940, the measured LO-leakage is compared to the predetermined threshold value. If the condition of process 940 is met, the process flow proceeds along the "yes" path out of decision block of process 940 to process 946. The DCI-DCQ coordinates corresponding to the most recent measurement (i.e., (I3, Q3)) and the corresponding LO-leakage measurement are saved in process 946, and the calibration process ends.

If the LO-leakage level measured in process 939 exceeds the predetermined threshold value, the distance d3 is calculated and the distance and corresponding coordinate point (I3, Q3) is saved in process 942. The process flow then loops back to process 934 by way of an incrementing process 944 and a decision block 948. Process 944 increments the test number n each time a chosen coordinate is determined to be outside the required range or threshold, and process 948 checks whether the current value of n meets or exceeds a predetermined maximum number. To prevent an undesirable number of measurements, the chip can be rejected when the value of n meets or exceeds the predetermined maximum, as shown by the "yes" path from the decision block 948 to process 923.

If the value of n is less than the predetermined maximum, the process flow proceeds along the "no" path from the decision block of process 948 to process 934 in which a new set of candidate coordinates having the most correct distances to the measured points are calculated based on the distances d1 to d3 and coordinates (I1, Q1), (I2, Q2) and (I3, Q3). One way to find such a set of coordinates would be to consider all the DCI-DCQ grid coordinates in the setting range and find the points which have the lowest square distance error. For example, the following generalized equation can be used to calculate the least square distance error for any test number n (n=4 in the present point in the process flow):

$$dn\_err^2 = \left(d1 - \sqrt{(Intest - I1)^2 + (Qntest - Q1)^2}\right)^2 +$$
$$\left(d2 - \sqrt{(Intest - I2)^2 + (Qntest - Q2)^2}\right)^2 + \ldots +$$
$$\left(d(n-1) - \sqrt{(Intest - I(n-1))^2 + (Qntest - Q(n-1))^2}\right)^2$$

A new point that has not yet been measured and having the corresponding lowest square distance is selected from the candidate set of points in process 936. Processes 934 to 940, 942, 944 and 948 are repeated as needed for each test iteration n until an acceptable calibration setting is determined or the maximum value of n is reached.

It should be appreciated from the foregoing that the number of measurements needed to estimate an acceptable setting will be in a range from 1 to 3 absent appreciable errors in measurement. If it is desired to have the LO-leakage minimum verified for the calculated set point, the maximum number of measurements increases only to 4. If, for example, the gradient deviates from what is expected, additional measurements may be required. However, even in this case the minimum setting will always be found (i.e., providing the minimum levels setting is within the possible calibration range). In an example of the present invention in which sign changes are allowed, the number of sign changes is at most 1. The probability of finding and verifying the minimum DCI-DCQ setting after 3 measurements is over 50 percent, which is a significant improvement over the above-described conventional method.

A further advantage of the present invention is that the number of measurements necessary for determining a calibration setting point or determining whether it is possible to calibrate with existing settings is independent of the number of the settings, whether in one or two-dimensions. For instance, a number of possible grid settings can be increased beyond the 49 settings of the above examples without a corresponding increase in measurements needed to determine a setting for minimum unwanted signal. Hence, the present invention also can increase device output by allowing for an expanded settable calibration range and/or provide for calibration using smaller step sizes for improved precision of calibration.

In a further embodiment of the present invention, it is possible to find the setting having minimum unwanted signal with a confirming measurement or that the minimum lies outside the calibration range in three measurements. (If the compensation gradient deviates appreciably from the expected gradient, the minimum lies near a border between two settings, and/or measurement errors occur, additional measurements may be required.)

In the present embodiment, the first and second calibration settings for measurement can be determined by choosing the first measurement point having a setting that is most distant from the other settings. Such a setting point would correspond to a corner of the grid. The second measuring point could be a setting point in another corner having one coordinate in common with the first measuring point (i.e., the second measuring point would not reside in a corner of the grid diagonally opposite to the first measuring point). In the present embodiment, the processes described above with respect to process flow 900, including ending the calibration process if either the first or the second points meet the requirement for minimal unwanted signal, determining the distances to a calibration setting of minimum unwanted signal, and determining the least squared sum of distance errors are performed as needed for the first and second measurements. Also as described above, the two measurements will result in two possible setting points, one on each side of a line defined by the first and second setting points (unless, of course, there is only one lowest distance error calibration setting, such as point B in FIG. 7). Accordingly, in most cases one point will lie outside the calibration range. Hence, the point that resides inside the calibration range should be chosen. This point would correspond to the point determined when searching the least distance error from among the possible calibration setting points. If the verifying third measurement shows more unwanted signal than the first, or—if no measurement errors exist—is above the threshold, then it is known in three measurements that the device cannot be calibrated because the point outside the calibration range has the minimum unwanted signal. If, on the other hand, the third measurement is below the threshold, an acceptable setting has been found and verified in three measurements.

With the present embodiment, if the calibration step size error is not significant, the probability is high that the minimum will be found in the third measurement (providing the minimum is within the calibration range). Tradeoffs in using the present embodiment compared to the above described example of choosing a default setting corresponding to zero compensation include that it is less likely to find a setting that meets the requirements in the first two measurements and that the possibility of rejecting the device in the first two measurements is reduced. The present embodiment uses the same processes as described above in process 900 except that decisions for choosing the first and second setting points for measurement of unwanted signal level involve limiting the choice to points only along the periphery of the grid. It should be appreciated that the choice for any pair of first and second settings may be based on a statistical distribution of the best settings.

The invention has been described with reference to particular embodiments. However, it will be readily apparent to those skilled in the art that it is possible to embody the invention in specific forms other than those of the preferred embodiment described above. This may be done without departing from the spirit of the invention. For example, while the foregoing examples describe performing an initial measurement at zero compensation or in a corner of a grid, it is to be understood that any (I, Q) coordinate of the grid can be used as a starting measurement. The particular coordinate choice for the second measurement point does not need to progress in a "positive" direction of compensation. Instead, the second point may be chosen in any direction of the grid, including points with both zero and nonzero (I, Q) coordinates, from the initial measurement point. Furthermore, while a modulating device was used in the embodiments described above, the present invention can be used to calibrate any component that would require similar calibration. For example, the fast calibration methods of the present invention may be used to calibrate demodulating devices.

To facilitate an understanding of the invention, many aspects of the invention have been described in terms of sequences of actions to be performed by elements of a computer system. It will be recognized that in each of the exemplary embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments may be referred to herein as "logic configured to" perform a described action, or alternatively as "logic that" performs a described action.

It will be apparent to those skilled in the art that various changes and modifications can be made in the fast calibration of DC offset of the present invention without departing from the spirit and scope thereof. Thus, it is intended that the present invention cover the modifications of this invention provided they come within the scope of the appended claims and their equivalents.

APPENDIX

Equation for the Output from an I and Q Mixer (In the equations, $ph_q=0$ when single sideband is wanted.)

$$MixOut = (DCI + A_i * \sin(bb*t)) * \sin(LO*t) + (DCQ + A_q * \cos(bb*t + ph_q)) * \cos(LO*t).$$

$$MixOut = (DCI + A_i * \sin(bb*t)) * \sin(LO*t) + (DCQ + A_q * (\cos(bb*t) * \cos(ph_q) - \sin(bb*t) * \sin(ph_q))) * \cos(LO*t).$$

$$MixOut = DCI * \sin(LO*t) + \frac{A_i}{2} * (\cos((bb-LO)*t) - \cos((bb+LO)*t)) + DCQ * \cos(LO*t) + \frac{A_q}{2} * \cos(ph_q) * (\cos((bb-LO)*t) + \cos((bb+LO)*t)) + \frac{A_q}{2} * \sin(ph_q) * (\sin((bb-LO)*t) + \sin((bb+LO)*t)).$$

-continued $$MixOut = \sqrt{DCI^2 + DCQ^2} * \cos\left(LO*t - \arctan\left(\frac{DCI}{DCQ}\right)\right) + \frac{A_i + A_q * \cos(ph_q)}{2} * \cos((bb-LO)*t) + \frac{A_q}{2} * \sin(ph_q) * \sin((bb-LO)*t) + \frac{A_q * \cos(ph_q) - A_i}{2} * \cos((bb+LO)*t) + \frac{A_q}{2} * \sin(ph_q) * \sin((bb+LO)*t).$$

$$MixOut = \sqrt{DCI^2 + DCQ^2} * \cos\left(LO*t - \arctan\left(\frac{DCI}{DCQ}\right)\right) + \sqrt{\left(\frac{A_i}{2} + \frac{A_q}{2} * \cos(ph_q)\right)^2 + \left(\frac{A_q}{2} * \sin(ph_q)\right)^2} * \cos((bb-LO)*t - ph_{lower}) + \sqrt{\left(\frac{A_i}{2} - \frac{A_q}{2} * \cos(ph_q)\right)^2 + \left(\frac{A_q}{2} * \sin(ph_q)\right)^2} * \cos((bb+LO)*t - ph_{upper}),$$

where:

$$ph_{lower} = \arctan\left(\frac{A_q * \sin(ph_q)}{A_q * \cos(ph_q) + A_i} + n*\pi\right)$$

$n = 1$ if $(A_q + A_i) < 0$ otherwise $n = 0$ $$ph_{lower} = \arctan\left(\frac{A_q * \sin(ph_q)}{A_q * \cos(ph_q) - A_i} + n*\pi\right)$$

$n = 1$ if $(A_q + A_i) < 0$ otherwise $n = 0$.

What is claimed is:

1. A method for determining which setting of a plurality of device input compensation settings provides a minimum of unwanted signal at an output of the device, comprising:
    a) applying a signal to an input of the device;
    b) setting the device to a first one of the plurality of device input compensation settings;
    c) measuring unwanted signal level at the first compensation setting;
    d) determining a first distance from the first compensation setting to a calibration setting resulting in minimum unwanted signal level based on the first measured level and a predetermined characteristic of the unwanted signal;
    e) setting the device to a second one of the plurality compensation settings;
    f) measuring unwanted signal level at the second compensation setting;
    g) determining a second distance from the second compensation setting to the calibration setting based on the second measured level and the predetermined characteristic; and
    h) determining the calibration setting based on the first and second settings and the first and second distances.

2. The method according to claim 1, comprising:
    comparing the first measured level with a predetermined threshold value, and if the first measured level is less than or equal to the predetermined threshold value, then preventing the performance of steps d) though h) and selecting the calibration setting to be the first setting.

3. The method according to claim 2, comprising:

comparing the second measured level with the predetermined threshold value, and if the second measured level is less than or equal to the predetermined threshold value, then preventing the performance of steps g) and h) and selecting the calibration setting to be the second setting.

4. The method according to claim 1, wherein the predetermined characteristic is a gradient corresponding to a change in unwanted signal level per change in calibration setting.

5. The method according to claim 4, wherein the predetermined characteristic of the unwanted signal is determined by applying a signal to an input of the device and measuring a change in unwanted signal between adjacent compensation settings.

6. The method according to claim 4, wherein the characteristic is determined by the device design.

7. The method according to claim 1, comprising saving the determined calibration setting.

8. The method according to claim 1, comprising verifying that the selected calibration setting is an acceptable calibration setting.

9. The method according to claim 8, wherein verifying further comprises:
   measuring a level of unwanted signal at the selected calibration setting; and
   comparing the measured value at the selected setting with a predetermined threshold level.

10. The method according to claim 9, further comprising saving the measured unwanted signal level and the selected calibration setting.

11. The method according to claim 1, further comprising:
   i) setting the device to a third compensation setting not previously measured;
   j) measuring unwanted signal level at the third compensation setting;
   k) determining a third distance from the third compensation setting to the calibration setting based on the third measured level and the predetermined characteristic; and
   l) determining the calibration setting in h) based on the first through third settings and the first through third distances.

12. The method according to claim 11, comprising:
   comparing the third measured level with a predetermined threshold value, and if the third measured level is less than or equal to the predetermined threshold value, then selecting the third setting as the calibration setting and then preventing the performance of steps k) and l).

13. The method according to claim 11, comprising verifying whether the determined calibration setting in l) is an acceptable calibration setting.

14. The method according to claim 11, wherein the first and second compensation settings are selected to have a common compensation amount in one dimension of compensation and the third compensation setting is selected to have a compensation amount in the one dimension different from the common compensation amount.

15. The method according to claim 1, wherein if the distance determined in d) is greater than a maximum allowable distance from the first setting, then rejecting the device and preventing performance of steps e) through h).

16. The method according to claim 1, wherein if the distance determined in g) is greater than a maximum allowable distance from the second setting, then rejecting the device and preventing the performance of step h).

17. The method according to claim 1, wherein the device input compensation settings are adjustable to vary compensation in two dimensions.

18. The method according to claim 17, wherein each setting corresponds to at least one type of compensation selected from DC offset, phase difference, and amplitude imbalance.

19. The method according to claim 17, wherein the device is an in-phase (I) and quadrature-phase (Q) modulator, and the two dimensions of each setting correspond to compensation for a signal on an I channel and a Q channel, respectively, of the modulator.

20. The method according to claim 17, wherein the device is an in-phase (I) and quadrature-phase (Q) modulator and each dimension of compensation compensates for imbalances between an I channel signal and a Q channel signal of the modulator.

21. The method according to claim 20, wherein one dimension corresponds to a phase imbalance between the I channel signal and the Q channel signal.

22. The method according to claim 20, wherein one dimension corresponds to an amplitude imbalance between the I channel signal and the Q channel signal.

23. The method according to claim 19, wherein a first dimension corresponds to compensating DC applied to the I channel and a second dimension corresponds to compensating DC applied to the Q channel.

24. The method according to claim 17, wherein the compensation settings comprise a grid of compensation settings.

25. The method according to claim 24, wherein the first compensation setting is selected from a setting at a corner of the grid.

26. The method according to claim 25, wherein the second compensation setting is selected from a setting at a corner of the grid having an amount of compensation in one dimension in common with the first compensation setting.

27. The method according to claim 24, wherein a center setting of the grid is selected as the first compensation setting.

28. The method according to claim 1, wherein determining the calibration setting further comprises:
   i) calculating a sum of distance errors for each compensation setting not measured, each said sum being based on difference between a determined distance and a distance between a measured setting and a non measured setting; and
   j) selecting a setting having the lowest sum of distance errors.

29. The method according to claim 28, further comprising:
   k) measuring unwanted signal level at the selected setting having the lowest distance error; and
   l) comparing the unwanted signal level measured in k) with a predetermined threshold value to verify that the selected setting is an acceptable calibration setting.

30. The method according to claim 29, wherein if it is verified that the selected setting is not acceptable and a different setting has an associated lowest distance error equal to the distance error of the unacceptable calibration setting, the different setting is selected.

31. The method according to claim 30, further comprising repeating k) and l) for the different setting.

32. The method according to claim 29, wherein if it is verified that the selected setting is not acceptable, the method further comprises:

m) setting the device to a setting not previously measured and having a next lowest distance error;

n) repeating i) through l) for the setting having the next lowest distance error; and o) repeating m) through n) until an acceptable calibration setting is verified or for a predetermined number of repetitions, whichever occurs first.

33. The method according to claim 1, wherein the unwanted signal comprises local oscillator leakage.

34. The method according to claim 1, wherein the unwanted signal comprises unwanted sideband for a single sideband signal.

35. Apparatus for determining which setting of a plurality of device input compensation settings provides a calibration setting of minimum of unwanted signal at an output of the device, comprising:

a signal generator for generating a test signal supplied to an input of the device;

means for setting the device to one of a plurality of device input compensation settings;

means for measuring a level of unwanted signal output from the device; and a processor for determining, for each measured compensation setting, a corresponding distance from the measured compensation setting to a calibration setting resulting in minimum unwanted signal level, said determination being based on the measured level of the unwanted signal and a predetermined characteristic of the unwanted signal, and for determining the calibration setting based on the measured settings and the determined distances, wherein the processor is further configured for calculating a sum of distance errors for each compensation setting not measured, each said distance error being based on difference between a determined distance and a distance between a measured setting and a non-measured setting.

36. A computer-readable medium containing a program which executes the steps of:

a) applying a signal to an input of the device;

b) setting the device to a first one of a plurality of device input compensation settings;

c) measuring unwanted signal level at the first compensation setting;

d) determining a first distance from the first compensation setting to a calibration setting resulting in minimum unwanted signal level based on the first measured level and a predetermined characteristic of the unwanted signal;

e) setting the device to a second one of the plurality compensation settings;

f) measuring unwanted signal level at the second compensation setting;

g) determining a second distance from the second compensation setting to the calibration setting based on the second measured level and the predetermined characteristic; and h) determining the calibration setting based on the first and second settings and the first and second distances.

37. The computer program of claim 36 further comprising the executable steps of:

comparing the first measured level with a predetermined threshold value, and if the first measured level is less than or equal to the predetermined threshold value, then preventing the performance of steps d) though h) and selecting the calibration setting to be the first setting.

38. The computer program of claim 36 further comprising the executable steps of:

comparing the second measured level with the predetermined threshold value, and if the second measured level is less than or equal to the predetermined threshold value, then preventing the performance of steps g) and h) and selecting the calibration setting to be the second setting.

39. The computer program of claim 36 further comprising the executable step of verifying that the selected calibration setting is an acceptable calibration setting.

40. The computer program of claim 39 further comprising the executable steps of:

measuring a level of unwanted signal at the selected calibration setting; and comparing the measured value at the selected setting with a predetermined threshold level.

41. The computer program of claim 40 further comprising the executable step of saving the measured unwanted signal level and the selected calibration setting.

42. The computer program of claim 36 further comprising the executable steps of:

i) setting the device to a third compensation setting not previously measured;

j) measuring unwanted signal level at the third compensation setting;

k) determining a third distance from the third compensation setting to the calibration setting based on the third measured level and the predetermined characteristic; and l) determining the calibration setting in h) based on the first through third settings and the first through third distances.

43. The computer program of claim 42 further comprising the executable steps of:

comparing the third measured level with a predetermined threshold value, and if the third measured level is less than or equal to the predetermined threshold value, then selecting the third setting as the calibration setting and then preventing the performance of steps k) and l).

44. The computer program of claim 42 further comprising the executable step of verifying whether the determined calibration setting in step l) is an acceptable calibration setting.

45. The computer program of claim 36, wherein if the distance determined in step d) is greater than a maximum allowable distance from the first setting, then rejecting the device and preventing performance of steps e) through h).

46. The computer program of claim 36, wherein if the distance determined in step g) is greater than a maximum allowable distance from the second setting, then rejecting the device and preventing the performance of step h).

47. The computer program of claim 36, wherein determining the calibration setting further comprises the executable steps of:

i) calculating a distance error for each compensation setting not measured based on the measured settings and the determined distances; and j) selecting a setting having the lowest distance error.

48. The computer program of claim 47, further comprising the executable steps of:

k) measuring unwanted signal level at the selected setting having the lowest distance error; and l) comparing the unwanted signal level measured in k) with a predetermined threshold value to verify that the selected setting is an acceptable calibration setting.

49. The computer program of claim 48, wherein if it is verified that the selected setting is not acceptable and a different setting has an associated lowest distance error equal to the distance error of the unacceptable calibration setting, the different setting is selected.

50. The computer program of claim 49, further comprising repeating k) and l) for the different setting.

51. The computer program of claim 48, wherein if it is verified that the selected setting is not acceptable, the program further comprises the executable steps of:

m) setting the device to a setting not previously measured and having a next lowest distance error;

n) repeating i) through l) for the setting having the next lowest distance error; and o) repeating m through n until an acceptable calibration setting is verified, or for a predetermined number of repetitions, whichever occurs first.

\* \* \* \* \*

UNITED STATES PATENT AND TRADEMARK OFFICE
CERTIFICATE OF CORRECTION

PATENT NO. : 7,369,813 B2 Page 1 of 1
APPLICATION NO. : 10/714675
DATED : May 6, 2008
INVENTOR(S) : Andersson It is certified that error appears in the above-identified patent and that said Letters Patent is hereby corrected as shown below:

In Column 1, Line 61, delete "modem" and insert -- modern --, therefor.

In Column 22, Line 65, in Claim 2, delete "though" and insert -- through --, therefor.

In Column 25, Line 66, in Claim 37, delete "though" and insert -- through --, therefor.

In Column 28, Line 6, in Claim 51, delete "m through n" and insert -- m) through n) --, therefor.

Signed and Sealed this

Thirtieth Day of December, 2008

JON W. DUDAS
*Director of the United States Patent and Trademark Office*